US007558064B2

(12) United States Patent
Nakamura et al.

(10) Patent No.: US 7,558,064 B2
(45) Date of Patent: Jul. 7, 2009

(54) COOLING APPARATUS

(75) Inventors: Kazuhiro Nakamura, Osaka (JP);
Tetsuya Shimada, Osaka (JP);
Katsuhiko Watabe, Osaka (JP)

(73) Assignee: Espec Corp., Osaka (JP)

( * ) Notice: Subject to any disclaimer, the term of this patent is extended or adjusted under 35 U.S.C. 154(b) by 88 days.

(21) Appl. No.: 11/195,418

(22) Filed: Aug. 1, 2005

(65) Prior Publication Data
US 2006/0023424 A1    Feb. 2, 2006

(30) Foreign Application Priority Data
Jul. 30, 2004   (JP) .............................. 2004-224841

(51) Int. Cl.
*H05K 7/20* (2006.01)
*G01R 31/02* (2006.01)
*F28B 9/00* (2006.01)

(52) U.S. Cl. ...................... 361/698; 361/691; 361/699; 361/718; 324/760; 62/172

(58) Field of Classification Search ................ 361/690, 361/691, 698, 699, 718; 62/259.2, 404, 121, 62/171–172, 176.4, 304, 401; 257/721, 714, 257/712; 165/80.4, 122, 287; 324/760
See application file for complete search history.

(56) References Cited

U.S. PATENT DOCUMENTS

| | | | | | |
|---|---|---|---|---|---|
| 4,745,354 | A | * | 5/1988 | Fraser | 62/259.2 |
| 4,897,762 | A | * | 1/1990 | Daikoku et al. | 361/689 |
| 5,131,233 | A | * | 7/1992 | Cray et al. | 62/64 |
| 5,290,710 | A | * | 3/1994 | Haj-Ali-Ahmadi et al. | 438/15 |
| 5,515,910 | A | * | 5/1996 | Hamilton et al. | 165/263 |
| 5,579,826 | A | * | 12/1996 | Hamilton et al. | 165/254 |
| 5,582,235 | A | * | 12/1996 | Hamilton et al. | 165/263 |
| 5,909,123 | A | * | 6/1999 | Budnaitis | 324/760 |
| 5,924,482 | A | * | 7/1999 | Edwards et al. | 165/104.33 |
| 5,943,211 | A | * | 8/1999 | Havey et al. | 361/699 |
| 5,999,404 | A | * | 12/1999 | Hileman | 361/699 |
| 6,108,201 | A | * | 8/2000 | Tilton et al. | 361/689 |
| 6,349,554 | B2 | * | 2/2002 | Patel et al. | 62/259.2 |
| 6,394,575 | B1 | * | 5/2002 | Kent | 347/21 |
| 6,445,200 | B2 | * | 9/2002 | Haseyama | 324/755 |
| 6,498,725 | B2 | * | 12/2002 | Cole et al. | 361/700 |
| 6,557,622 | B2 | * | 5/2003 | Frank et al. | 164/455 |
| 6,580,610 | B2 | * | 6/2003 | Morris et al. | 361/699 |
| 6,595,014 | B2 | * | 7/2003 | Malone et al. | 62/171 |

(Continued)

FOREIGN PATENT DOCUMENTS

JP    61-114377    6/1986

(Continued)

*Primary Examiner*—Jayprakash N Gandhi
*Assistant Examiner*—Bradley H Thomas
(74) *Attorney, Agent, or Firm*—Jordan and Hamburg LLP

(57) ABSTRACT

The cooling apparatus comprises an air supply system, a water supply system, and a sprayer, and has a structure such that water and compressed air are mixed and the air is sprayed together with the water converted into mist onto the upper surface of a device attached to a socket of a burn-in board. The heat generated by the device is removed via the mist and air that falls on the upper surface. When a burn-in test is conducted the cooling apparatus adjusts the water and air supply so that the device is cooled to the target temperature.

12 Claims, 9 Drawing Sheets

U.S. PATENT DOCUMENTS

| | | | |
|---|---|---|---|
| 6,889,509 B1* | 5/2005 | Cader et al. | 62/118 |
| 6,975,028 B1* | 12/2005 | Wayburn et al. | 257/718 |
| 6,996,996 B1* | 2/2006 | Cader | 62/118 |
| 7,032,403 B1* | 4/2006 | Tilton et al. | 62/259.2 |
| 2001/0002541 A1* | 6/2001 | Patel et al. | 62/259.2 |
| 2002/0070745 A1* | 6/2002 | Johnson et al. | 324/765 |
| 2002/0113142 A1* | 8/2002 | Patel et al. | 239/128 |
| 2003/0090282 A1* | 5/2003 | Akram et al. | 324/754 |
| 2004/0019452 A1* | 1/2004 | Song et al. | 702/130 |
| 2004/0032274 A1 | 2/2004 | Cader et al. | |
| 2004/0050545 A1* | 3/2004 | Tilton | 165/287 |
| 2004/0051545 A1* | 3/2004 | Tilton et al. | 324/760 |
| 2004/0182564 A1* | 9/2004 | Tremmel | 165/247 |
| 2004/0194492 A1* | 10/2004 | Tilton et al. | 62/314 |
| 2005/0041393 A1* | 2/2005 | Tustaniwskyi et al. | 361/699 |
| 2005/0063157 A1* | 3/2005 | Tustaniwskyi et al. | 361/699 |

FOREIGN PATENT DOCUMENTS

| | | |
|---|---|---|
| JP | 3-030459 | 2/1991 |
| JP | 4-61259 | 2/1992 |
| JP | 4-321113 | 11/1992 |
| JP | 8-211122 | 8/1996 |
| JP | 11-231943 | 8/1999 |
| JP | 2000-97990 | 4/2000 |
| JP | 2000-214213 | 8/2000 |
| JP | 2004-061489 | 2/2004 |

* cited by examiner (a)

(b)

(a)

(b)

COOLING APPARATUS

BACKGROUND OF THE INVENTION

The present invention relates to a cooling apparatus capable of conducting cooling so as to obtain the target temperature of a semiconductor device that comprises a plane-like surface, generates heat when electric current is passed therethrough, has the temperature thereof rising to above the target temperature, and has the temperature of the surface rising.

A burn-in apparatus for semiconductor devices (referred to hereinbelow as "devices") is generally known in which a multiplicity of devices are mounted on burn-in boards, the boards are stacked in multiple stages in a temperature controlled chamber, electric current is passed through the devices, hot air with a temperature adjusted to the prescribed temperature, for example 125° C., is caused to flow parallel to the burn-in boards inside the chamber and circulate, while uniformly cooling the multiplicity of devices (see, for example, Patent References 1, 2, 3). With such a burn-in apparatus, in the case of conventional devices, the internal temperature of the devices generating heat when a current is passed therethrough is adjusted to a temperature appropriate for the burn-in test, which is about 150° C., in correspondence with the temperature of the circulating hot air, and a burn-in test of the multiplicity of devices can be conducted with good efficiency.

Furthermore, Patent Reference 3 describes, as the conventional technology, that detecting the temperature inside the chamber and maintaining it at a constant level is insufficient for directly controlling the temperature of the device itself and, therefore, a diode is formed in a hollow space of a semiconductor chip and the junction temperature of the semiconductor chip is evaluated based on the electric characteristics of the diode (see the same Patent Reference 3).

Furthermore, the Patent Reference 3 also suggests a burn-in test apparatus in which a wiring section for temperature measurements is disposed over the entire integrated circuit section of each semiconductor chip, the average temperature of the chip is detected via a connection pad provided similarly to the connection pad for current supply to the integrated circuit section, the air with adjusted temperature is supplied from air-blow fans disposed in correspondence with each semiconductor chip in a temperature adjusting apparatus, and the air flow amount supplied to each chip is controlled so that the average temperature of the chip becomes the target burn-in temperature.

On the other hand, in recent years, devices generating a large amount of heat, for example, up to about 300 W when an electric current is passed therethrough, have appeared on the market and the burn-in apparatuses have to be adapted to conduct the burn-in test thereof. However, the above-described conventional apparatuses of a general hot air circulation system cannot be adapted for the above-mentioned devices generating a large amount of heat because the air is used therein as a heat transfer medium that has to remove a large amount of heat generated by the device when an electric current is passed therethrough and the air has a low specific gravity and specific heat and can remove but a small amount of heat. For this reason, the temperature of the circulating air is reduced, the blowing speed is raised, and the amount of air is increased to increase the amount of removed heat, but in this case the size of the apparatus itself is increased, a large difference in cooling effect is observed between the upstream and downstream zones of the circulating air, and the accuracy of burn-in temperature decreases. Moreover, even if all the aforementioned measures are taken, the amount of removed heat is still limited to about 30 W. For these reasons, such devices generating a large amount of heat cannot be burn-in tested with the apparatuses of the hot air circulation system.

Furthermore, in the apparatuses where the temperature of each chip is detected and the amount of cooling air supplied to each chip is controlled, the amount of blown air can be somewhat increased and the amount of removed heat can be increased, but because the cooling medium is air, no sufficient increase in the amount of removed heat can be attained and such apparatuses similarly cannot be adapted to burn-in test the devices that generate a large amount of heat.

A temperature control apparatus of an air injection system is known as another example of the apparatuses used, e.g., for burn-in testing the devices. In such an apparatus, air injection nozzles are disposed above and below each object and low-temperature air is ejected from such nozzles (see Patent Reference 4). In this apparatus, no problems are associated with temperature distribution among the devices even when the flow speed of the air is increased to increase the flow rate thereof, but because the heat transfer medium is air, the amount of the removed heat cannot be greatly increased for the same reasons as described above, and the apparatus cannot be adapted to devices generating a large amount of heat.

A temperature test apparatus is known as a burn-in apparatus using no hot air, wherein a multiplicity of electronic components, which are devices, are carried on a printed board serving as a burn-in board, a cooling plate having circulating therein a cooling liquid that is cooled in a water-cooled heat exchanger is brought into contact with the printed board, and the electronic components are temperature tested, while being cooled if necessary (see Patent Reference 5).

With this apparatus, the amount of heat removed by cooling can be increased because heat is taken from the electronic components to boil and evaporate the liquid coolant. However, in such an apparatus, the entire bottom surface of the plate is covered with the liquid coolant and heat enters only from the portion of this surface that is in contact with the electronic device. For this reason, heat transfer at the liquid coolant side is of a perfect film boiling and evaporation mode and, therefore, a substantially increased value of heat transfer coefficient of this surface portion cannot be obtained. Another problem associated with this apparatus is that because there is a difference between the pressure inside the plate and the external pressure, which is usually the atmospheric pressure, and because the plate surface area increases since all the electronic components have to be cooled with one plate, the plate thickness cannot be decreased and heat penetration ability cannot be improved. Yet another problem is that because the plate has a flat surface with high flexural rigidity, sufficient contact with all the electronic components cannot be obtained due to the unavoidable small differences in level. Because of the aforementioned problems, cooling performance that enables a burn-in test of devices generating a large amount of heat cannot be obtained.

A cooling structure of mounted semiconductor chips is known in which each individual semiconductor chip is covered with a cap, bellows are disposed therebetween, a nozzle is disposed above each individual cap, a liquid coolant is supplied thereto from a coolant supply tube, the coolant liquid is atomized by the nozzle and blown onto the cap, the heat generated by the semiconductor chip and transferred to the cap is absorbed by the coolant particles, the particles are evaporated and released from a release vent, the gas obtained is cooled in a refrigerator to convert it into liquid, and this liquid is again supplied to the coolant supply tube, this cooling structure making it possible to remove the heat from the mounted semiconductor chips with good efficiency (see Patent Reference 6).

With this cooling structure, because the cooling liquid is atomized, the cooling liquid boils in a state close to nucleate boiling and, therefore, heat can be removed from the chip with good efficiency. However, the degree to which liquid can be atomized is limited even if liquid alone is ejected from the nozzle tip under increased pressure. For this reason, for the cooling liquid to be instantaneously evaporated to assume a nucleate boiling state when the cooling liquid is brought into contact with a cap heated by the heat generated by the chip, the difference between the temperature of the cap surface and the temperature of the cooling liquid has to be increased. For this reason, in this reference source, a perfluorocarbon with a boiling point less than about 20° C. is described as an example of the cooling liquid used.

However, if the heat transfer medium is limited to such low-boiling coolants, a limitation is placed on the types of heat transfer media that can be used. For example, heat transfer media that can be easily disposed of at low cost like water cannot be used. Other problems include that a refrigerator becomes necessary, the equipment configuration becomes complex, and the equipment cost rises.

Furthermore, a problem arising when only a coolant of one type is used to conduct latent heat cooling with a strong cooling action is that if the liquid is supplied when the operation is started, the increase in temperature caused by heat generation by the device is in a transient state and, even if the liquid is in the form of fine particles, a liquid pool appears on the cooling surface due to insufficient amount of heat generated by the device, making it impossible to conduct smooth transition to a stationary nucleate boiling state after the increase in temperature. In this case, because only a liquid coolant is pressure injected, if the pressure is reduced and the amount of injected coolant is decreased, the liquid is not atomized. The resultant problem is that the amount of liquid can be adjusted only within a narrow range and the amount of supplied liquid cannot be decreased in a temperature rise process. Another problem is the formation of liquid pools when the operation is stopped.

Furthermore, when the mounted semiconductor chip is cooled, the chip may be appropriately cooled to a low temperature such that chip operation reliability can be attained and chip endurance can be maintained. Therefore, in the stationary operation mode, a liquid coolant of one type may be used at an almost constant flow rate. However, for the cooling device to be also suitable for burn-in testing the devices that generate a large amount of heat, it has to operate so that the temperature inside the device is usually maintained at about 150° C. The resultant problem is that accurate temperature control is impossible with a coolant supply structure that has a narrow flow rate adjustment range, as described hereinabove.

[Patent Reference 1] Japanese Patent Application Laid-open No. H8-211122 (FIG. 1 and relevant explanation in the specification).

[Patent Reference 2] Japanese Patent Application Laid-open No. H11-231943 (FIG. 1 and Par. No. 25 in the specification).

[Patent Reference 3] Japanese Patent Application Laid-open No. 2000-97990 (FIG. 4 and Par. Nos. 3, 4; FIGS. 1 and 2 and relevant explanation in the specification).

[Patent Reference 4] Japanese Patent Application Laid-open No. H4-321113 (FIG. 1 and relevant explanation in the specification).

[Patent Reference 5] Japanese Utility Model Application Laid-open No. S61-114377 (FIG. 1 and relevant explanation in the specification).

[Patent Reference 6] Japanese Patent Application Laid-open No. H4-61259 (FIG. 1 and relevant explanation in the specification).

BRIEF SUMMARY OF THE INVENTION

It is an object of the present invention to resolve the above-described problems inherent to the conventional technology and to provide a cooling apparatus that has a simple structure and low costs of equipment and operation and that is suitable for burn-in testing the devices that generate a large amount of heat.

In order to resolve the above-described problems, a first aspect of the invention provides a cooling apparatus capable of conducting cooling so as to obtain a target temperature of a semiconductor device that comprises a plane-like one surface, generates heat when electric current is passed therethrough, has the temperature thereof rising to above the target temperature, and has the temperature of the one surface rising, this apparatus comprising compressed air supply means capable of supplying compressed air, liquid supply means capable of supplying liquid that serves as a heat transfer medium for the cooling and has a saturation temperature lower than the temperature of the one surface at the time of the aforementioned temperature rise, and gas-liquid mixing means provided so that if the compressed air and the liquid are supplied thereto and the liquid is mixed with the compressed air, the liquid is atomized and reaches the one surface.

Therefore, even when the amount of heat generated by the operating semiconductor device is large, this amount of heat can be removed.

Thus, the following relationship exists between the features of the first aspect of the invention and the operation effect thereof. Because the saturation temperature of the liquid serving as a heat transfer medium is set lower than the temperature of the one surface, the liquid can absorb the latent heat of evaporation from the one surface. Furthermore, if the liquid is added to the air as a heat transfer medium for cooling the semiconductor device, because the specific gravity and the specific heat of the liquid are sufficiently higher than those of the air, the liquid has a sufficiently large latent heat enabling heat absorption during evaporation and, therefore, a large amount of heat can be absorbed even when the volume flow rate is low. As a result, a small amount of liquid can be mixed with a large amount of air, thereby enabling the atomization of the liquid. Moreover, because the liquid is thus converted into fine particles that can reach the one surface, the fine particles that reach the one surface assume a state of nucleate boiling in which the heat transfer coefficient of the fine particles reaches maximum on the one surface and, therefore, the particles are reliably evaporated, while being present on the surface. In addition, because the liquid, even after the atomization, has a specific gravity substantially higher than that of the air that is mixed therewith, almost the entire liquid reaches the one surface due to the velocity component thereof directed toward the one surface, even when it is deflected by the air flow. Eventually, a large amount of heat generated by the semiconductor device can be reliably removed via the one surface due to a large amount of absorbed heat comprising the sensible heat and latent heat realized during heat absorption by the liquid.

Furthermore, because the air that removes a small amount of heat and liquid that removes a large amount of heat can be supplied, at the initial stage where the semiconductor device is actuated and the amount of heat generated thereby is low, rapid increase in the semiconductor device temperature can be inhibited, an appropriate temperature rise state can be assumed, and a smooth transition from the initial state to a state with stationary heat generation and stationary heat removal where the liquid is used can be provided for by initially supplying the air that removes a small amount of heat, without immediately supplying the liquid which unnecessarily extends the interval required to reach the target temperature and greatly extends the time required to attain a stabilized ratio of heat generation and heat removal and to obtain the target temperature with good stability.

Furthermore, when the operation of the semiconductor device is stopped, after the temperature becomes lower than the target temperature, the supply of liquid is terminated, only the air supply is maintained, and the original dry state of the ambient atmosphere that assumed a state with a correspondingly high humidity due to liquid evaporation is restored by using the generated heat.

Because the liquid is atomized and assumes a nucleate boiling state with the highest heat transfer coefficient on the one surface of the semiconductor device, heat generated by the semiconductor device can be removed despite the absence of a large difference in temperature with the one surface. Therefore, a suitable liquid can be selected from a wide range of heat transfer liquids with various saturation temperatures.

Because the air that removes a small amount of heat and liquid that removes a large amount of heat can be supplied, the temperature of the semiconductor device can be rapidly and accurately adjusted to the target temperature by combined adjustment of the supplied amounts of the air and liquid.

A second aspect of the invention provides a cooling apparatus capable of conducting cooling so as to obtain a target temperature of a semiconductor device that comprises a plane-like one surface, generates heat when electric current is passed therethrough, has the temperature thereof rising to above the target temperature, and has the temperature of the one surface rising, this apparatus comprising compressed air supply means capable of supplying compressed air, liquid supply means capable of supplying liquid that serves as a heat transfer medium for the cooling and has a saturation temperature lower than the temperature of the one surface at the time of the aforementioned temperature rise, a separation member that can be pressed against the one surface and separated from the one surface and is provided so that it covers the one surface when pressed thereagainst and facilitates passage of heat from the one surface, and gas-liquid mixing means provided so that if the compressed air and the liquid are supplied thereto and the liquid is mixed with the compressed air, the liquid is atomized and reaches the surface of the separation member on the side opposite from the one surface.

With the second aspect of the invention, in addition to obtaining the same operation effect with the components identical to those of the first aspect of the invention of claim 1, a separation member is provided that can be pressed against the one surface and separated from the one surface, this member being provided so that it covers the one surface when pressed thereagainst and facilitates passage of heat from the one surface. Therefore, because the air and liquid do not fall directly on the one surface of the device, this surface is unaffected by the collisions with the air and liquid and can be reliably prevented from being contaminated or discolored.

In this case, as described hereinabove, a structure is employed in which the air and fine particles of liquid that are supplied from the air-liquid mixing means and that can reach the one surface of the semiconductor device do not fall directly on the one surface, but the heat of the one surface easily passes to the surface on the opposite side of the separation member that is pressed against the one surface. Therefore, the temperature of the surface on the opposite side rises to a temperature close to the temperature of the one surface and the air and fine particles fall on the surface on the opposite side and flow therealong in the same manner as when they directly fall on the one surface. As a result, the temperature of the air and fine particles rises, the fine particles are evaporated, and the heat generated by the semiconductor device can be removed in a necessary amount from the one surface via the surface on the opposite side and the separation member.

Furthermore, the separation member can also partition the electric structural components, including the semiconductor devices, from the surface on the side opposite to the one surface in the separation member that is affected by fine particles of the liquid produced in the air-liquid mixing means. Therefore, the risk of the electric components malfunctioning due to short circuiting, or being rusted and damaged can be completely prevented, this risk being due to the fact that the liquid is evaporated, the air containing the liquid vapor becomes humid, this high-humidity air is cooled to a temperature below the dew point by the upper portions of the surrounding structure, which is at a temperature close to normal temperature, in the sealed space that is usually sealed with the surrounding structure in order to cool the semiconductor device, the cooled air forms condensate, and the resultant liquid flows down on the electric structure components located therebelow, or that the liquid does not assume a state of fine particles at the initial stage of using the air-liquid mixing means and falls down, or that sometimes the liquid is not completely evaporated and liquid pools are formed below.

According to a third aspect of the invention, in addition to the features of the first aspect of the invention, the one surface faces downward.

Therefore, the semiconductor device can be attached so as to face downward and the electric structural components coupled to the device can be disposed above the device. As a result, as described above, the risk of the electric components malfunctioning due to short circuiting, or being rusted and damaged can be prevented even when the water from condensation or liquid that was not atomized at the initial stage of using the air-liquid mixing means falls down or liquid pools are formed therebelow due to incomplete evaporation of the liquid.

In this case, the air and fine particles of the liquid are sprayed upward and fall on the one surface of the semiconductor device facing downward, but because the air has a sufficiently low specific gravity, the liquid assumes the shape of fine particles with a small diameter despite a large specific gravity thereof, and because those particles have a sufficiently small weight and are present in a high-speed air flow, the movement thereof is practically unaffected by gravity. Therefore, when the liquid falls on the one surface, even the part thereof that was not instantaneously evaporated does not move in the direction of falling down under gravity; the trajectory thereof is deflected from the propagation direction at the time it reached the one surface and the liquid moves in the direction along the one surface, while being reliably evaporated in this process.

According to a fourth aspect of the invention, in addition to the features of the first and second aspects of the invention, there are provided a temperature detection means for detecting the temperature of the semiconductor device, flow rate adjustment means capable of adjusting the flow rate of the liquid, and control means for controlling the flow rate adjustment means so that the temperature detected by the temperature detection means becomes the target temperature.

Therefore, when the semiconductor device reaches a stationary operation state, manual control becomes unnecessary, labor can be saved, and reliability during operation can be increased.

In this case, because the liquid is mixed with air and atomized, even if the liquid flow rate is changed, the size of fine particles is not changed significantly. As a result, the liquid is reliably evaporated. For this reason, the liquid flow rate can be effectively controlled and, therefore, the semiconductor device temperature can be accurately brought to the target temperature.

According to a fifth aspect of the invention, in addition to the above-described features, the flow rate adjustment means comprises a liquid flow rate adjustment valve capable of adjusting the flow rate of the liquid supplied from the liquid supply means and a compressed air flow rate adjustment valve capable of adjusting the flow rate of the compressed air supplied from the compressed air supply means, and the control means controls the liquid flow rate adjustment valve and the compressed air flow rate adjustment valve so as to change the ratio of the flow rate of the liquid and the flow rate of the compressed air.

Therefore, the target temperature can be adjusted with good accuracy by using the compressed air that is suitable for fine adjustment of the amount of heat.

According to a sixth aspect of the invention, in addition to the features of the first and second aspects of the invention, when the target temperature is the temperature at which the semiconductor device is burnt in, the liquid is water.

Therefore, the liquid can be obtained easily and at a low cost. In this case, even when pure water is used as the water to maintain a higher purity of the one surface of the semiconductor device onto which the water falls, the pure water can be easily and inexpensively obtained at the semiconductor device fabrication plant. Furthermore, when water is used as the liquid, it can be easily discarded.

On the other hand, in the burn-in test, the target temperature is set to about 150° C. or higher to expose semiconductor devices to severe temperature conditions. Therefore, the temperature of the one surface of the semiconductor device becomes higher than 100° C. For this reason, even with water, which has an evaporation temperature of 100° C. under atmospheric pressure, if the fine particles thereof come into contact with the one surface, they boil and can remove the heat generated by the semiconductor device. Furthermore, in this case, because water usually has the highest specific gravity and specific heat among the liquids, the latent heat of evaporation thereof is several times higher than that of other liquids. Water is therefore optimum as the liquid for burn-in testing the semiconductor devices that generate a large amount of heat.

BRIEF DESCRIPTION OF THE DRAWINGS

Accompanying the specification are figures which assist in illustrating the embodiments of the invention, in which.

DETAILED DESCRIPTION OF THE INVENTION

Figure 1:
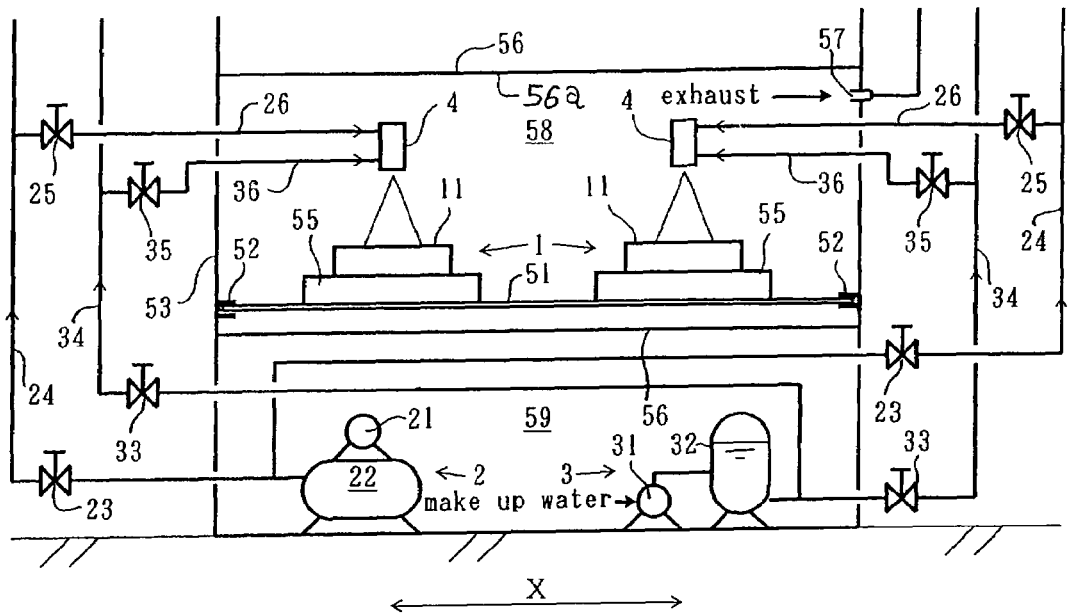
FIG. 1 is an explanatory drawing illustrating an example of the entire configuration of the cooling apparatus employing the present invention, (a) and (b) are the front and plan views of the inner side thereof.
Figure 1:
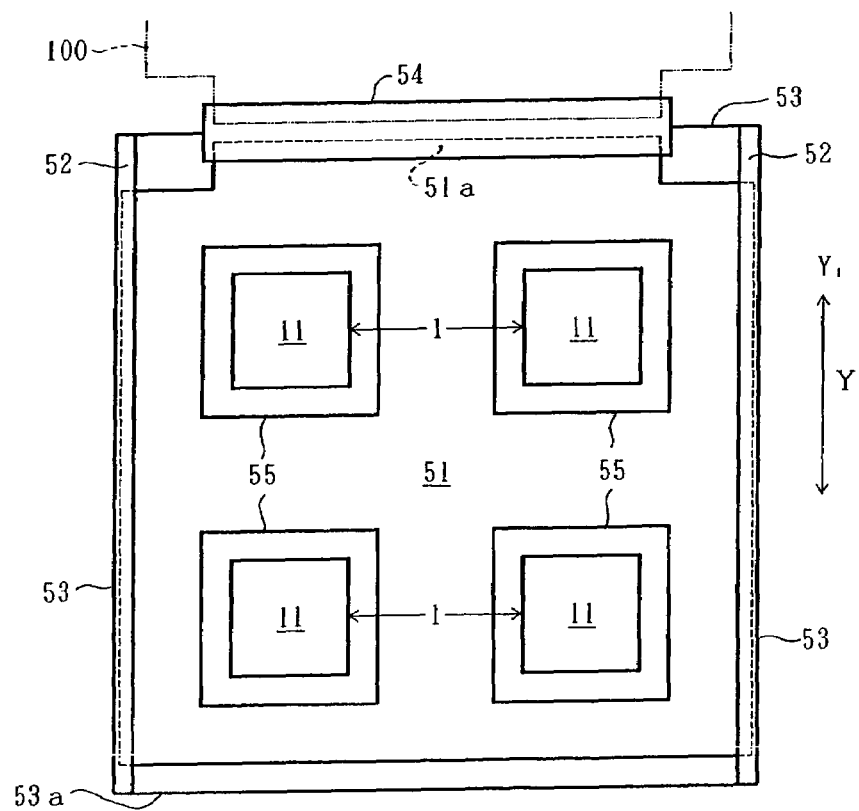
Figure 2:
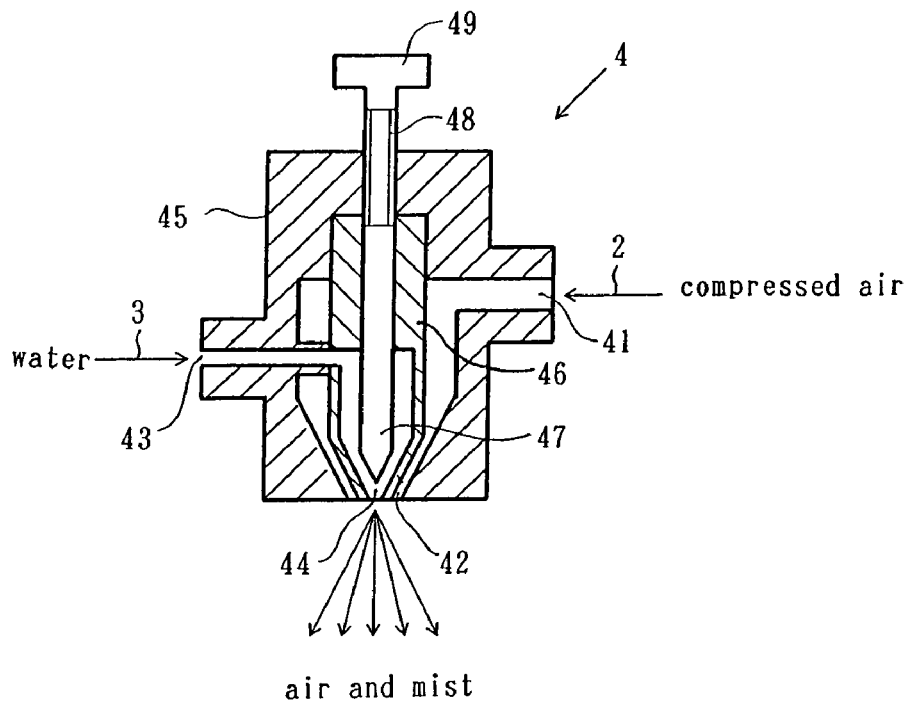
FIGS. 2(a) and (b) are cross-sectional views illustrating the configuration example of the sprayer used in the aforementioned apparatus.
Figure 2:
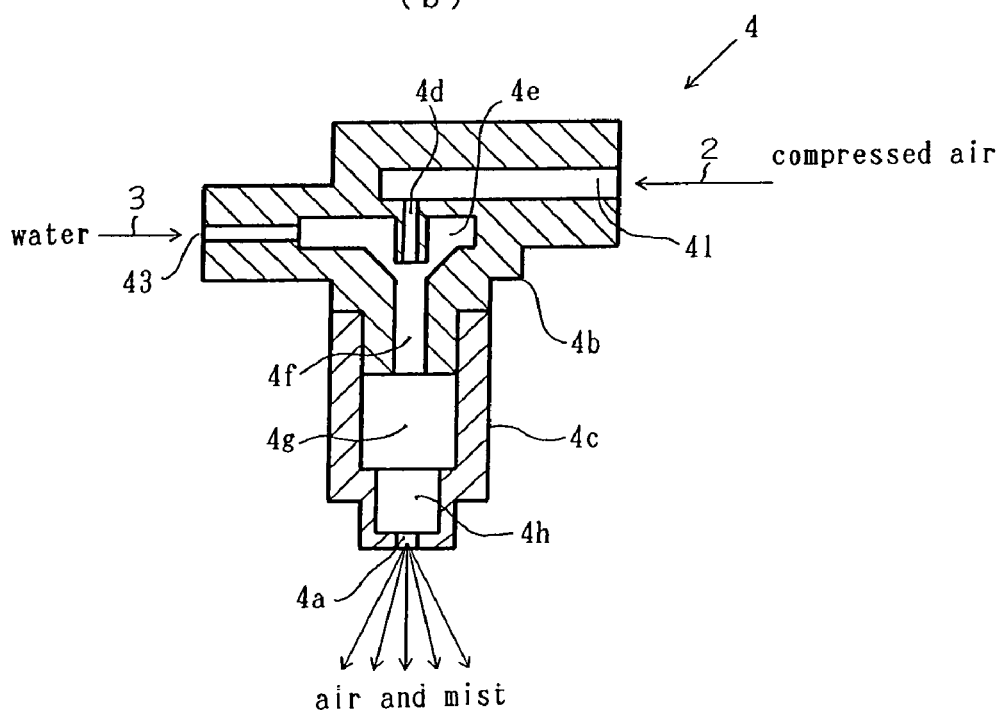

FIG. 1 shows an example of the entire structure of the cooling apparatus employing the present invention. FIG. 2 illustrates a configuration example of a sprayer as gas-liquid mixing means used in this cooling apparatus.

The cooling apparatus of the present example is an apparatus employed to burn-in test a device 1 that comprises an upper surface 11, in the present example a flat surface, and is formed so that it generates heat when electric current is passed therethrough, the temperature thereof rises to a temperature higher than a temperature t, in the present example about 150° C., as the target temperature, and the temperature of the upper surface 11 also rises accordingly, this cooling apparatus being capable of cooling the device 1 to the temperature t. This cooling apparatus comprises an air supply system 2 as compressed air supply means, a water supply system 3 as liquid supply means, and a sprayer 4 as gas-liquid mixing means.

A burn-in board 51 (referred to hereinbelow simply as "board 51") for carrying the device 1, a guide groove 52 for inserting the board into the cooling apparatus and removing it therefrom, a case 53, and a connector 54 for electric connection to a relay board 100 are provided as the usual structural components of the cooling apparatus. The board 51 is composed of a printed substrate, a socket 55 is mounted thereon, and an edge connector 51a for detachable connection to the connector 54 is formed at the distal end thereof. As burn-in test equipment, in addition to the cooling apparatus, a driver/test board (not shown in the figure) for connection to the relay board 100, a relay board, and a control board are installed in the order of description outside the cooling apparatus. Those components make it possible to supply power to the device 1, send necessary electric signals, and actuate the device 1 for a burn-in test.

The figure shows the components of one stage of the cooling apparatus carrying four devices 1, but usually a multistage stacked configuration is used that is composed, for example, of 5 to 10 identical stages with components of the same structure. Each stage is a sealed space 58 surrounded by a case 53 having a door section 53a and a partition plate 56 with an evacuation vent 57 opened therein. An equipment installation section 59 is disposed below the first stage, and main mechanical components of water and air supply systems are provided in this section. The case 53 has a thermally insulated structure, except part of the equipment installation section 59.

In a cooling apparatus in which a multiplicity of devices 1 are carried in multiple stages, the board 51 may have a structure that is mechanically detachably attached to the connector 54. In this case, the printed substrate is provided with an additional reinforcing structural section and a coupling portion of the mechanism used for detachable attachment to the connector is provided in this section.

Figure 3:
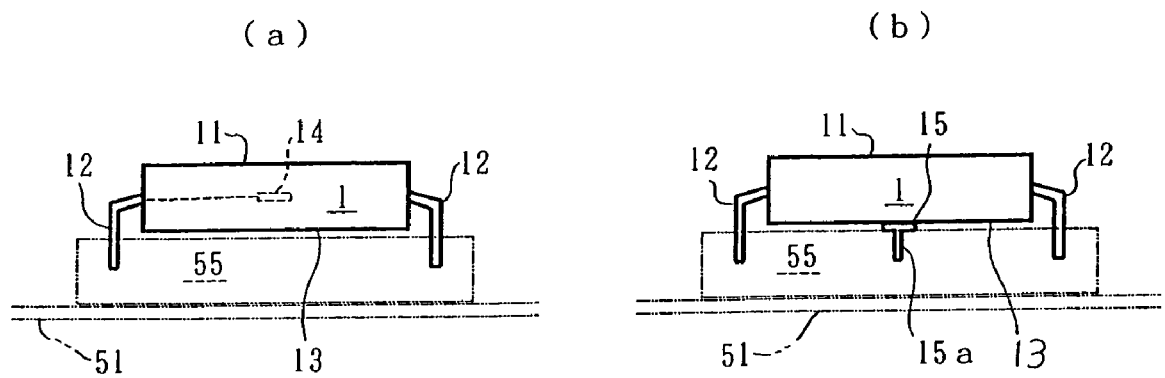
FIGS. 3(a) and (b) are explanatory drawings illustrating an example of the device cooled with the aforementioned apparatus.

The device 1 is of a high heat generation type that generates an amount of heat of about 300 W in a conductive state thereof, but similarly to the usual devices, has a structure comprising a multiplicity of pins 12 shown in FIG. 3(a), and when the device is detachably attached to the burn-in board, those pins are detachably attached to a socket 55. The upper surface 11 is formed from a metal with good thermal conductivity such as copper plated with nickel so as to provide for good heat dissipation and is, for example, a wide flat square surface with a side of 4 cm. The lower surface 13 is usually made of a heat-resistant resin. It goes without saying that the present invention is also applicable to the device 1 of a shape and structure different from the shape and structure shown in FIG. 3.

Because temperature control is important for the device 1 of such a high heat generation type, some of such devices have a structure with a temperature sensor 14 incorporated therein. In this case, the sensor 14 is connected to the appropriate pins of a multiplicity of pins 12 and the leads thereof are led out as an external wiring from a control board (not shown in the figure) via a printed wiring of the board 51 and used for temperature display or temperature control. When the temperature sensor 14 is not incorporated in the device 1, a structure is used in which a provisional temperature sensor 15 integrated with the pin 15a, as shown in FIG. 3(b), is mounted on the lower surface 13 and similarly connected to the printed wiring of the board 51.

The compressed air system 2 is means capable of supplying compressed air and comprises an air compressor 21, an air tank 22, an air main valve 23, an all-stage common air system 24, an individual air valve 25, and an individual air system 26. In the present example, compressed air at a pressure of about 0.6 MPa is supplied to the sprayer 4. The air tank 22 is preferably a compressed air tank rated for a pressure of about 0.8 MPa. For this reason, the air compressor 21 is usually automatically started and stopped so as to maintain the pressure in the air tank 22 within a constant narrow pressure range up to 0.8 MPa. The temperature of the compressed air may be controlled to an appropriate level.

The water supply system 3 is means capable of supplying water as liquid serving as heat transfer medium for cooling, comprises a water pump 31, a water tank 32, a water main valve 33, an all-stage common water system 34, an individual water valve 35, and an individual water system 36, and supplies water under a pressure slightly higher than the atmospheric pressure to the sprayer 4. It is preferred that pure water be used as the aforementioned water, and it is usually done so. In semiconductor manufacturing plants, pure water is used in large quantities and may be procured at a low cost. The water tank 32 is preferably a pressure tank rated at a pressure of about 0.1 MPaG. For this reason, the water pump 31 is usually automatically started and stopped so as to maintain the water surface in the tank 32 at a level within a constant range. The tank 32 may be a head tank open to the atmosphere, or the water pump 31 may be provided in a position downstream of the tank 32.

Water at normal temperature is usually used as the aforementioned water, but the temperature of the supplied water can be adjusted to the appropriate temperature by providing the water supply system 3 with a heat exchanger. For example, a heater maybe provided to heat the water and to adjust the temperature thereof automatically or manually to about 80° C. In such a case, when mist is generated and it falls on the device 1 to cool the device, as described hereinbelow, the sensible heat cooling effect of water is decreased, but because the water temperature approaches the saturation temperature, the water is easily completely evaporated when it falls on the device 1, a latent heat cooling effect can be reliably obtained, and the occurrence of problems associated with insufficient evaporation of mist can be prevented.

The sprayer 4 is means provided so that compressed air and water are supplied thereto via the respective supply systems 2, 3 and the water is mixed with the compressed air to form fine droplets that reach the upper surface 11 of the device 1. The schematic structure of the sprayer is shown in FIGS. 2(a) and (b). The sprayer 4 shown in figure (a) comprises an air inlet hole 41, an air outlet hole 42, a water inlet hole 43, a water outlet hole 44, an outer tube 45 where those holes are formed, an inner tube 46, a needle valve 47 capable of adjusting the amount of water, an adjustment screw 48, and an adjustment knob 49. The sprayer 4 shown in figure (b) similarly comprises an air inlet hole 41, a water inlet hole 43, an outlet hole 4a, an upper structural body 4b where those holes are formed, a lower structural body 4c, an air nozzle portion 4d, a water chamber 4e, a mixing nozzle portion 4f, a mixing chamber 4g, and an injection chamber 4h.

In the present example, as described hereinabove, compressed air and water are mixed inside or outside the single sprayer 4 to form an air-mist mixed flow, but it is also possible to provide separately a nozzle for water and a nozzle for air, and to mix the water and air ejected from these two nozzles outside the nozzles, thereby forming and supplying an air-mist mixed flow. Furthermore, a plurality of sprayers 4 may be provided for one device 1 in correspondence with the amount of heat generated by the device. Moreover, the sprayed substance may be not only liquid and air, but also fine particles of ice or fine particles of dry ice.

The above-described cooling apparatus operates and demonstrates the effect thereof in the manner as follows.

When a burn-in test of the device 1 is conducted, first, the air supply system 2 and water supply system 3 are operated. In the air supply system 2, the air compressor 21 is automatically operated and the air tank 22 is filled with compressed air that is pressure controlled to a pressure range of about 0.65-0.7 MPa. The air in this process is air cooled with an air cooler (not shown in the figures) installed on the compressor and also the air that emitted heat to the ambient medium within the retention time. Therefore, the temperature thereof is usually slightly higher than the normal temperature, which is the ambient temperature, and is for example about 30° C. if the normal temperature is 20° C.

Furthermore, individual air valves 25 provided for each device in the air supply system 2 are so regulated that the air is ejected at almost the same flow rate from any sprayer 4 that corresponds to characteristics of each sprayer 4 or to the individual air system 26 branched from the all-stage common air system 24. However, when not all tested devices 1 generate the same amount of heat, the individual air valves 25 are regulated to obtain an air flow rate corresponding to the amount of heat generated by each device 1.

In the water supply system 3, the pump 31 is automatically operated, and water is supplied so that the water level in the water tank 32 falls within a constant level range, with the position shown in FIG. 1 as a center, and so that the pressure falls within a range of about 0.11-0.12 MPa. This water is taken, for example, from a pure water distribution line of a semiconductor manufacture plant and is usually at about the normal temperature. The individual water valves 35 provided for each device in the water supply system 3 are regulated, like the individual air valves 25, to a degree of opening such that about the same amount of water is supplied to each sprayer. In the case where the amounts of heat generated by devices 1 are not identical, the valves are regulated in correspondence with respective amounts of generated heat.

Then, the devices 1 are attached to the sockets 55 mounted on the board 51, both ends of the board 51 in the width X direction are inserted into the guide grooves 52, the board 51 is inserted in the longitudinal direction $Y_1$ along the grooves, and the edge connector 51a located at the distal end thereof is inserted into the connector 54. As a result, the devices 1 are connected to the control board via the board 51, relay board 100, drive/test board (not shown in the figure) and relay board in the order of description.

As a result of the above-described operations, a state is assumed in which a burn-in test can be implemented. Then, a test apparatus is operated, power is supplied to the devices 1, necessary electric signals are supplied, and the devices 1 are actuated. Furthermore, at the same time, the air main valve 23 of the air supply system 2 of the cooling apparatus is opened. The water main valve 33 of the water supply system 3 is opened, for example, in about 1 min, in correspondence with the temperature rise characteristic of the device 1 that is the test object.

If the device 1 assumes the operation state, it consumes a power of about 300 W at maximum and generates heat corresponding to this power. As a result, the temperature of the device 1 gradually rises from the normal temperature of the initial state. However, in this initial state, because the temperature of the upper surface 11 of the device 1 is not sufficiently high, only the air main valve 23 is open, as described hereinabove.

If the air main valve 23 is open, almost the same amount of compressed air is supplied to all the sprayers 4 from individual air valves 25 whose opening degree was adjusted in advance for each sprayer individually. If the compressed air enters into the sprayer from the air inlet hole 41, the air pressure changes rapidly. As a result, in the sprayer 4 shown in FIG. 2(a) or (b), the air flows from the air outlet hole 42 or outlet hole 4a at a high speed, expands as shown in FIG. 4(a) and as schematically shown in FIGS. 1 and 2, falls on the portion of a constant size of the upper surface 11 of the device 1, flows along the remaining portion of the upper surface 11, is reflected by the upper surface 11, absorbs heat of the upper surface 11 in this process, diffuses into the sealed space 58, and is then released from the evacuation vent 57.

As shown in FIG. 4(b), the portion of the upper surface 11 (a square with one side a=40 mm) of the device 1 which comes into contact with the air is a round portion 11a with a diameter d within a range surrounded by a circle in the figure. This diameter d is preferably larger than about a/2; it is determined by the flow rate of air or water, structure, size, and type of the sprayer 4, and the arrangement position thereof, and those conditions are selected, for example, so as to obtain the relationship of d=3a/4, as shown in FIGS. 4(c) and (d). In this case, the air directly falls on the corresponding portion of the upper surface 11, a larger portion of this air flows along the remaining portion of the upper surface 11, absorbs heat from this surface, and a good cooling effect can be provided on the device 1 in correspondence with the heat emission state from the periphery thereof. Furthermore, a structure can be employed such that the arrangement position of the sprayer 4 can be adjusted manually or automatically in the vertical direction, which is a direction perpendicular to the upper surface 11, and the range of d can be adjusted to a certain degree.

With the above-described air flow, the air mainly flows so as to collide with the upper surface 11. Therefore, the heat exchange ability can be greatly improved and the cooling effect can be increased in comparison with the conventional burn-in apparatuses of a hot air circulation system in which air flow is parallel to the upper surface 11. Furthermore, rapid increase in the temperature of device 1 can be absorbed and a smooth transition can be made to subsequent cooling based on cooling with water. Another possible option is to open the air main valve 23 completely, for example, within several tens of seconds or to open it in correspondence with the temperature of the device 1, rather than to open it completely from the very beginning.

If an actuation state is assumed in which power is continuously supplied to the device 1, while it is being cooled with the air, the amount of heat removed by the air is insufficient in comparison with the amount of heat generated by the device 1. Therefore, the temperature of device 1 rises. For this reason, after the time $T_1$ of about 1 min elapses, as described above, since the power supply and air cooling was started, the water main valve 33 of the water supply system 3 is opened and water is supplied to the device 1 via the sprayer 4. The time $T_1$ is usually determined by the detected temperature ta of the temperature sensor 14 assembled with the device 1 or the detected temperature $ta_1$ of the provisional temperature sensor 15 provisionally mounted on the device 1.

Thus, for example, if ta becomes about 130° C. or $ta_1$ becomes about 110° C., the average temperature tf serving as the temperature of the upper surface 11 of device 1 exceeds 100° C. As a result, in the present example, water is employed as liquid having a saturation temperature lower than this temperature tf. Therefore, if water is supplied to the device 1 after the temperature tf has exceeded 100° C., the water evaporates and a large latent heat cooling effect is demonstrated. Therefore, the temperature ta or $ta_1$ is determined so as to enable such an effect. Furthermore, if the device or air cooling conditions are the same, the time $T_1$ becomes almost a constant time. Therefore, it is also possible to measure $T_1$ in advance in a burn-in test in a burn-in apparatus production factory or device production plant and to open the water main valve 33 by manual operations or with a timer according to this $T_1$.

Figure 4:
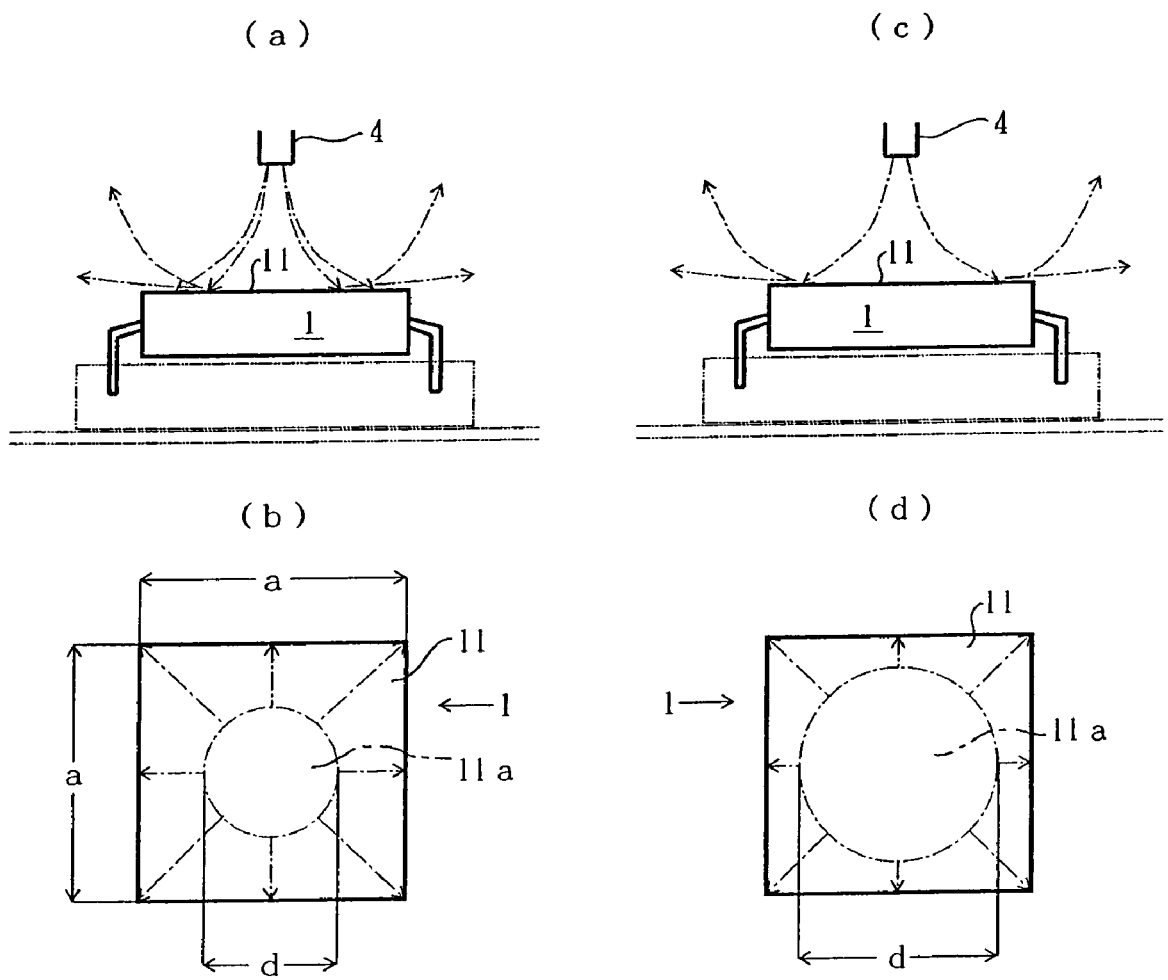
FIGS. 4(a) through (d) are explanatory drawings illustrating the state in which the air and mist fall on the device.

If the air and water main valves 23, 33 are open, in the sprayer 4 shown in FIG. 2(a), the air flows out at a high speed from the outlet hole 42, as described hereinabove. At the same time, water enters the sprayer 4 from the water inlet hole 43, is ejected from the narrowed water outlet hole 44 by the difference in pressure between the internal pressure that is slightly higher than the atmospheric pressure and the pressure in the portion of water outlet hole 44 where a negative pressure is formed by the high-speed air flow, and expands radially, forming particles. Those particles are divided by the high-speed air flow and form fine particles. In the apparatus of the present example, fine particles of water with a diameter of about 10-20 μm (sometimes referred to hereinbelow as "mist") are formed, these particles are mixed with the air, transported mainly by the air flow, and together with the air fall on the circular surface with a diameter d on the upper surface 11, as shown in FIG. 4.

In the sprayer 4 shown in FIG. 2(b), the compressed air that entered from the air inlet hole 41 expands in the air nozzle 4d and flows out at a high speed to the mixing nozzle portion 4f.

Water that entered from the water inlet hole 43 is mixed with the air flow and enters the mixing nozzle portion 4f from the water chamber 4e. Such air and water are mixed effectively in this portion and then mixed thoroughly in the mixing chamber 4g having a rapidly expanded cross section. The resultant mixture enters the injection chamber 4h, becomes mist of the same particle size as described above, is ejected, and falls on the circular surface with a diameter d of the upper surface 11 shown in FIG. 4, in the same manner as described above.

At this time, because the average temperature tf of the upper surface 11 exceeds 100° C., the mist composed of fine particles is immediately heated by heat transfer from the upper surface 11 and evaporated. Furthermore, the mist that fell on the upper surface 11, but was not instantaneously evaporated is moved radially from inside the circular surface with a diameter d to the periphery thereof, as shown in FIGS. 4(b) and (d), by high-speed components and air flow directed along the upper surface 11, as shown in FIGS. 4(a) and (c). In the course of this movement, the mist absorbs heat from the surface 11 and is completely evaporated on the surface 11. The air continues cooling the upper surface 11 in the same manner as before.

If the mist is thus evaporated, the amount of removed heat is high because the latent heat of evaporation is large. Thus, the ratio of the total amount of heat removed by water ($Q_2+Q_3$) to the total amount of heat removed by air $Q_1$ is $$(Q_2+Q_3)/Q_1 = q_2 \cdot \rho_2 (c_2 \cdot \Delta t_2 + R)/q_1 \cdot \rho_1 \cdot c_1 \cdot \Delta t_1$$

where $q_1$ and $q_2$ (L/min) stand for flow rates of air and water, $\rho_1$ and $\rho_2$ (kg/L) stand for respective densities, $c_1$ and $c_2$ (kJ/kg °C.) stand for specific heat under constant pressure, $\Delta t_1$ and $\Delta t_2$ (°C.) stand for increase in temperature of the air and water when the device 1 is cooled, $Q_1$ and $Q_2$ (kJ/min) stand for amounts of sensible heat removed by the air and water, $Q_3$ (kJ/min) stand for the amount of latent heat removed by water, and R (kJ/kg) stand for latent heat of water.

Assuming that water is heated from 20° C. to 100° C. through $\Delta t_2 = 80°$ C. and evaporated, the following results can be obtained (detailed calculations are omitted):

$$(c_2 \cdot \Delta t_2 + R) \approx 8 c_2 \cdot \Delta t_2$$

$$(Q_2+Q_3) \approx 8 Q_2 = 8 q_2 \cdot \rho_2 \cdot c_2 \cdot \Delta t_2$$

$$(Q_2+Q_3)/Q_1 = 8(q_2/q_1) \cdot (\rho_2/\rho_1) \cdot (c_2/c_1) \cdot (\Delta t_2/\Delta t_1).$$

Here, under the assumption that the temperature of the entire amount of the air rises from 20° C. to 60° C. through $\Delta t_1 = 40°$ C., $q_1$ will be 30 L/min at maximum and $q_2$ will be 8 mL/min at maximum. Assuming that $q_2/q_1 = 8/(30 \times 10^3)$, we will obtain $(\rho_2/\rho_1) \approx 1/(1.2/10^3) \approx 10^3/1.2$, $(c_2/c_1) \approx 4/1$, and $\Delta t_2/\Delta t_1 = 80/40$.

Therefore, $$(Q_2+Q_3)/Q_1 \approx 8 \times 8 \times 10^3 \times 4 \times 80/(30 \times 10^3 \times 1.2 \times 1 \times 40)$$
$$\approx 14.2.$$

Thus, in the present example, the amount of heat removed by the water from the device 1 assumes a sufficiently large value of about 14 times that of the heat removed by the air, even if the flow rate of water is small.

As a result, an excessively large amount of heat generated by the devices generating a large amount of heat reaching 300 W that could not be handled by the conventional air cooling can be removed and the devices can operate with the temperature thereof being maintained at a target level of about 150° C. during the burn-in test.

If the device 1 is actuated and a transient operation state in which the device is cooled while the air and water are supplied thereto over a fixed interval elapses, a stationary burn-in operation is maintained for about 48 hours in which the device 1 generates an almost constant amount of heat and the cooling apparatus maintains the internal temperature t of the device 1 at about 150° C., while removing an almost constant amount of heat corresponding to the generated amount of heat. Within this interval, because the device 1 is operated under conditions of high heat generation, water, which has a high cooling effect, flows at a flow rate close to a maximum flow rate and the compressed air flows at a comparatively low flow rate only necessary to convert water into mist.

Even in this stationary operation, the temperature t unavoidably fluctuates due to changes in the operation environment. Therefore, a highly accurate burn-in test has to be conducted so that those fluctuations do not exceed a fixed range. For this purpose, the amount of heat removed by cooling with the cooling apparatus is adjusted.

The amount of heat removed by cooling can be adjusted mainly by varying the water flow rate or more accurately by changing the flow rate of compressed air in the sprayer 4 shown in FIG. 2(b). When changing the flow rate of water directly, it is increased or decreased by adjusting the opening degree of the water main valve 33 or individual water valves 35, but because this adjustment causes fluctuations in the pressure of water supplied to the sprayer 4, the size of water particles ejected from the water outlet hole 44 also fluctuates. However, as described hereinabove, because the finely atomized water is further finely atomized by a high-speed air flow, the fluctuations in water pressure do not produce any significant effect and the water can be converted into mist with a necessary particle size. As a result, it is possible to generate an adjustable amount of mist with good reliability, remove the amount of heat from the device 1 in correspondence with the amount of mist, and maintain good temperature accuracy during a burn-in test.

With the sprayer 4 shown in FIG. 2(b), the amount of heat removed by cooling can be changed by directly changing the amount of water, as described hereinabove, similarly to the sprayer shown in FIG. 2(a), the amount of heat removed by cooling can be also adjusted by changing the flow rate of compressed air and indirectly changing the amount of water. Thus, if the flow rate of compressed air is increased in the fixed flow rate range of compressed air, the pressure inside the mixing nozzle 4f rises and water flow tends to decrease under the effect of this pressure. The amount of water can be adjusted by using this characteristic. Furthermore, when the air flow rate is thus adjusted, comparatively fine adjustment is possible. Furthermore, because the air is not an uncompressible fluid like water, the valve opening degree can be changed rapidly and, therefore, eventually the amount of water can be adjusted with good accuracy and rapidly and the amount of heat removed by cooling can be similarly adjusted.

On the other hand, with the sprayer 4 shown in FIG. 2(a), the amount of heat removed by cooling also can be finely directly adjusted by the air flow rate. For example, when the measured temperature ta actually measured with a sensor 14 or the measured temperature $ta_1$ obtained by estimation from the temperature actually measured with a sensor 15 as a temperature corresponding to the burn-in set temperature ts fluctuates in a wide range, for example, in excess of 3° C. with respect to ts=150° C., initially the opening degree of the water main valve 33 is adjusted, the flow rate of water with a high heat removing effect is varied and when the difference between ts and ta assumes a fixed small value, for example, no more than 3° C., the opening degree of the air main valve 23 is adjusted and the amount of heat removed by cooling is varied within a small range by the cooling action of air, which is sufficiently weaker than that of water. As a result, the burn-in temperature can be obtained rapidly and with good accuracy.

When the burn-in time elapses and the test is completed, the electric power supplied to the device is lowered and finally the power supply is cut off. At this time, because ta drops significantly, the water main valve 33 is gradually closed in correspondence with this decrease and when it is fully closed, the air main valve 23 is gradually closed. When the air main valve 23 is closed to a certain degree and ta becomes 150° C. or lower, the air flow rate attained at this time is maintained for a fixed short interval, the heat generated by the device 1 is employed, and the inside of the closed space 58 is dried by supplying and evacuating the air.

If one cycle of the burn-in test is completed, the edge connector 51a is drawn out from the connector 54, the burn-in board 51 is pulled out from the cooling apparatus, and the devices 1 are removed from the sockets 55. When the test is repeated and eventually the entire burn-in test is completed, the operation of the compressor 21 and pump 31 is terminated.

As described hereinabove, the burn-in test of devices generating a large amount of heat can be conducted by using the cooling apparatus employing the present invention. In this case, because cooling and mist transportation action by air are used, when the test is started, the transition from the start state to the stationary state of the device is facilitated; in the stationary state, a large amount of heat generated by the device can be removed and the temperature of the burn-in test can be accurately adjusted within a narrow range; and when the test is completed, an effect of drying with air can be obtained. Therefore, the burn-in test can be conducted very effectively.

Figure 5:
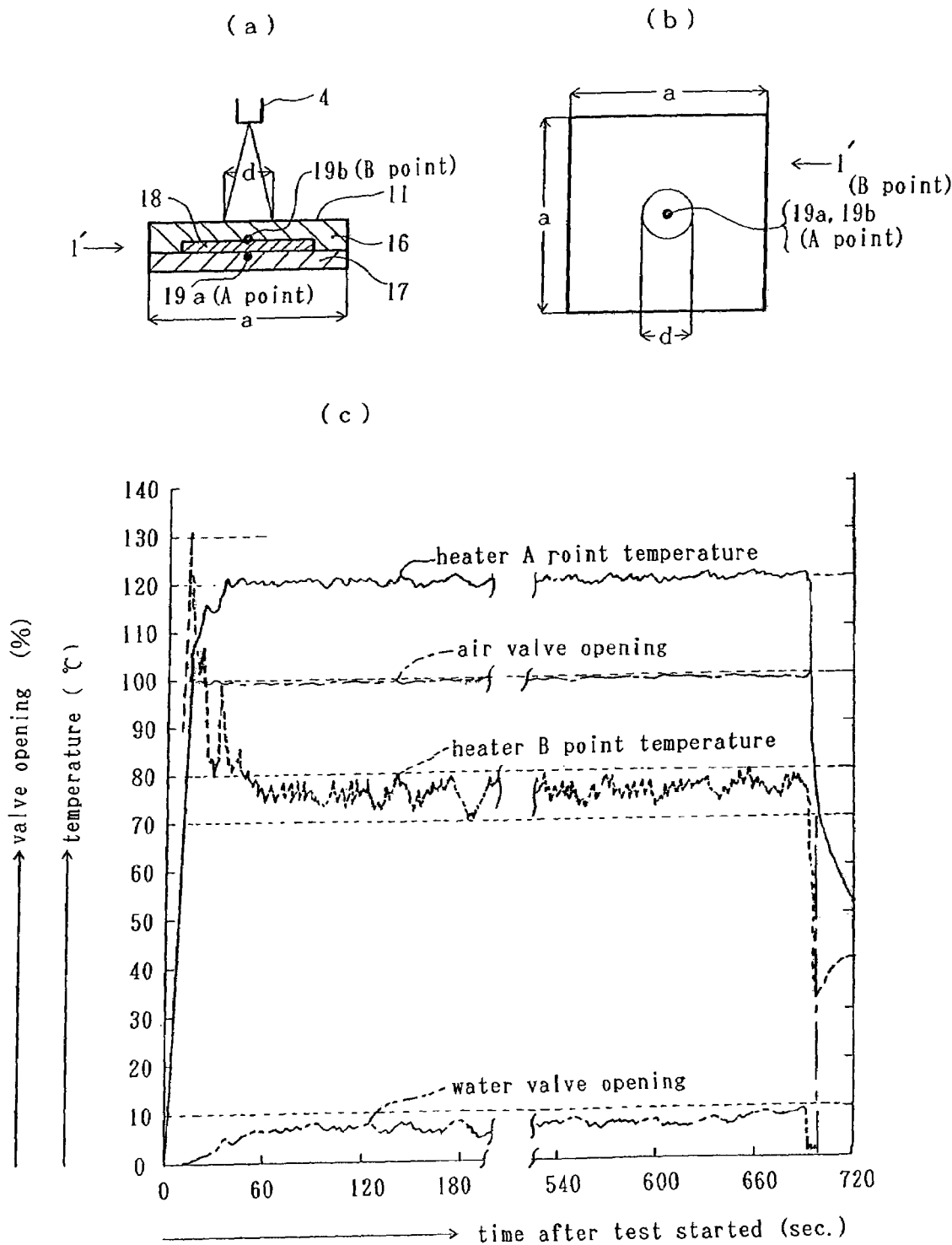
FIGS. 5(a) through (c) are explanatory drawings illustrating the state of the device cooling test and test results.

FIG. 5 shows the results obtained when the inventors conducted a cooling test with air and mist by fabricating a sample article simulating the device 1. The results are discussed below.

1. Products Used in the Test

1) Sample Article 1': Article Fabricated by Simulating the Device 1

Structure: a heat-generating body 18 is introduced between the upper portion 16 made from copper and having the upper surface 11 plated with nickel and a lower portion 17 made from a heat-resistant resin. The upper surface 11 is in the form of a square with a length of one side a of 40 mm, similarly to the structure shown in FIG. 4. A lower temperature sensor 19a and upper temperature sensor 19b for measuring and controlling the temperature are attached in point B and point A in the upper and lower positions of the heat-generating body 18 in the central location of the surface.

Amount of heat generated by the heat-generating body: 210 W.

2) Air Valve: Equivalent to the Below-described Individual Electric Air Valve 27 Shown in FIG. 10.

Maximum supplied air pressure: 0.6 MPaG.

Flow rate variation range: 0-30 L/min.

3) Water Valve: Equivalent to Individual Water Valve 37 Shown in FIG. 10.

Maximum supplied water pressure: 0.1 MPaG.

Flow rate variation range: 2-8 mL/min.

2. Test Conditions

In the test, power was supplied to the sample article, a rated current was passed, the heat-generating body was caused to generate heat at an output of 210 W, the air valve was at the same time fully opened, and the valve 37 was controlled by the detected temperature of the lower temperature sensor 19a. A continuous rated conduction test was thereafter carried out for about 12 min, power supply was then terminated, and the output was reduced to 0. The ambient temperature in the test was about 15° C. and water and air had the same temperature.

3. Test Results

1) The temperature of point A, which was the control object portion, could be controlled within a fluctuation range as wide as about 3° C.

2) The temperature of point B fluctuated within a range as wide as amount 10° C., but this was because the point B was not the control object and was directly sprayed with the mist from the sprayer 4.

3) In the test, the diameter d of the region on the upper surface 11 that was directly affected by the mist assumed a small value of about 10 mm (a/4). For this reason the temperature of point B in the central location decreased to below 100° C. (about 70-80° C.) and the temperature of the center of the surface was assumed to decrease to 65-70° C. (not measured).

4) Thus, the temperature did not rise to 100° C. in the central position of the upper surface 11, but when the mist fell on this surface, instantaneous or gradual evaporation was immediately observed in the locations where the temperature was assumed to be 100° C. or higher and absolutely no water droplets were found to remain on the upper surface 11.

The above-described results confirmed that the mist mixed with a high-speed air flow can assume an appropriate particle size, reach the upper surface 11, cool the inside of the device through this surface, and maintain an almost constant temperature inside the device. Furthermore, the sprayer 4 prepared for the test was an oversized device with an opening degree of 10% or less during actuation. For this reason, it was necessary to decrease the distance to the upper surface 11 and to fit the aforementioned diameter d in a narrow range of a/4. However, optimizing the design of the sprayer 4 makes it possible to obtain the diameter d of from 2a/4 to 3a/4 and higher and to provide for a uniform target temperature inside the device 1.

Thus, if the mist falls on the upper surface 11 from the direction toward the upper surface, the central portion is cooled with the mist with the highest efficiency and the cooling effect tends to weaken with the distance therefrom. However, because heat is readily dissipated from the corners and periphery of the device 1, the effect of uniformly cooling the inside of the device can be eventually obtained.

Figure 6:
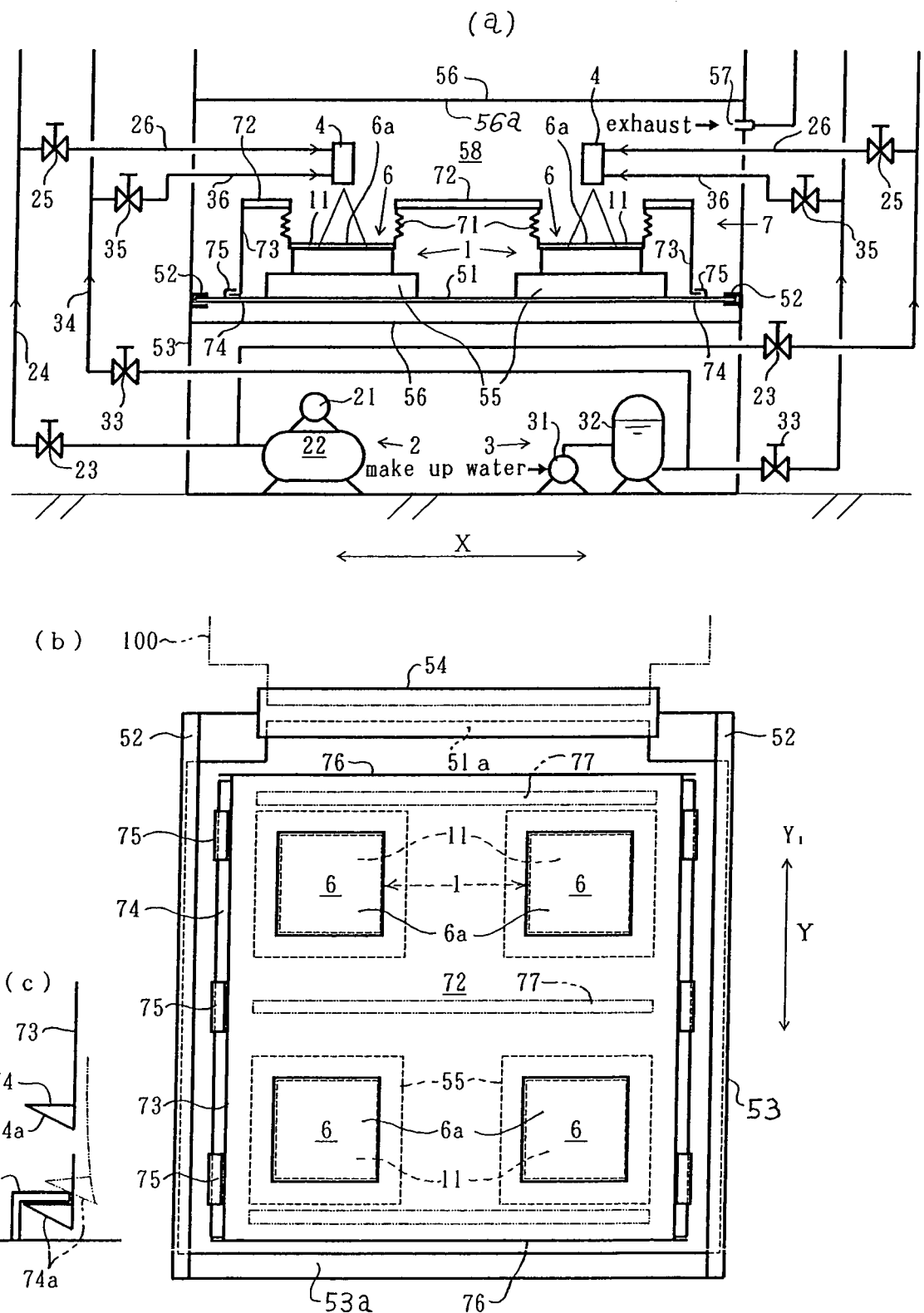
FIG. 6 is an explanatory drawing illustrating the entire configuration of another example of the cooling apparatus employing the present invention, (a) and (b) are the front and plan views of the inner side thereof, (c) shows an example of the state during the attachment of the mounting structural section

FIG. 6 illustrates another example of the cooling device employing the present invention.

The cooling apparatus of the present example comprises a separation member 6 that can be pressed against the upper surface 11 of the device 1 and withdrawn therefrom and is provided so as to cover the upper surface 11 after being pressed against it and to facilitate the passage of heat from this surface. In the present example, a mounting structural section 7 for mounting the aforementioned separation member that can be pressed against the upper surface and withdrawn therefrom and that facilitates the passage of heat from the upper surface 11 after being pressed against it comprises a bellows 71 mounted on the circumference of the separation member 6 and serving as a member surrounding the separation member, a support plate 72 with a high rigidity having the bellows mounted thereon, a side plate 73 mounted so that the support plate 72 can be fixed to the burn-in board 51 and so as to partition the device 1 and the closed space 58, a foot plate 74, a lock member 75 mounted on the burn-in board 51 so as to be pressed against the foot plate 74 and fix it when it is inserted, and front and rear plates 76 that are separated from the side plate 73 to prevent the restriction thereof and serve similarly as partitions. If necessary, a lateral beam 77 shown by a two-dot-dash line in FIG. 6(b) can be mounted on the support plate 72 to increase the flexural rigidity thereof in the X direction.

In the apparatus of the present example, the sprayer 4 is provided so that, of the surfaces of the separation member 6, the sprayed matter reaches a surface 6a that is on the opposite side from the upper surface 11 of the device 1.

Figure 7:
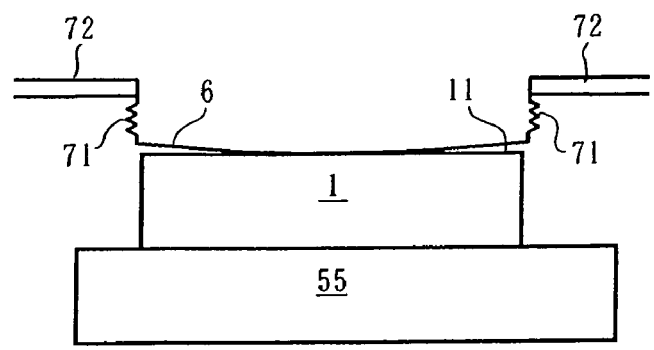
FIG. 7(a) through (f) are explanatory drawings illustrating another example of the pressure contact structure of a separation member.
Figure 7:
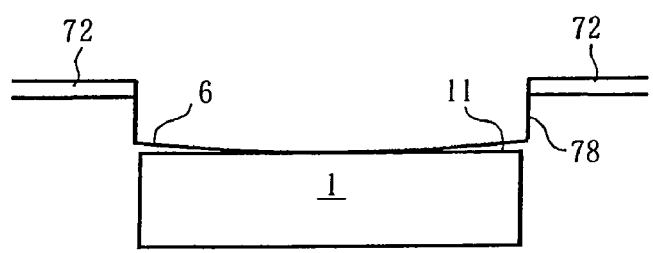
Figure 7:
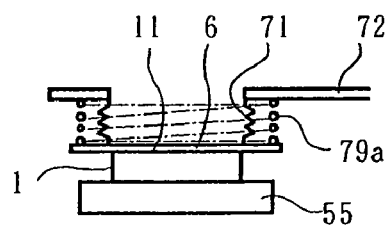
Figure 7:
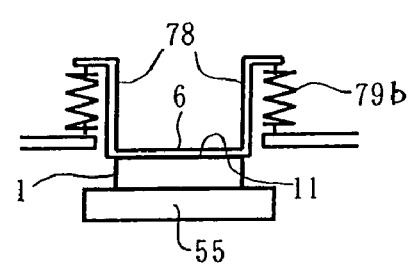
Figure 7:
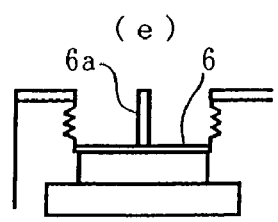
Figure 7:
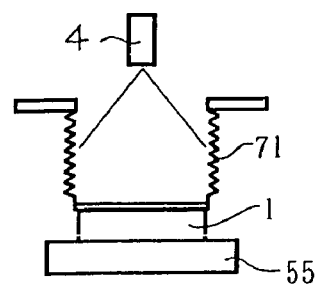

The separation member 6 is usually made from a metal with good thermal conductivity, such as copper or aluminum, so as to facilitate the passage of heat, and is in the form of a thin sheet with a thickness thereof being, for example, about 1 mm or less. The thin sheet can be a flat sheet or, as shown in FIG. 7(a), a curved sheet that is made slightly convex on the side of the upper surface 11 so as to become a perfectly flat surface when pressed by an appropriate force to the upper surface 11.

When the separation member 6 is in the form of a curved sheet, it can be made from a very thin metal, for example, with a thickness of about 0.1 mm, but a heat-resistant resin that is deformed more easily than the metal may be also used with a further reduced curvature of the curved surface. When the separation member 6 is formed to have a curved surface, the surrounding member can be in the form of a simple plate material 78, as shown in FIG. 7(b), rather than in the form of an expandable member such as bellows. With such a curved separation member 6, the central section thereof is greatly deformed and the contact pressure force herein increases when a contact pressure is applied thereto. As a result, it is possible to cool effectively the central portion of the upper surface 11 of the device, which is unaffected from heat dissipation from the circumferential zone and which is where the temperature rises.

The side plate 73 is formed to have the dimensions such that when the foot plate 74 is inserted into the lock plate 75 and the mounting structural section 7 is mounted on the burn-in board 51, the side plate can apply a force necessary to compress the bellows 71 and to press the separation member 6 against the upper surface 11 so as to provide for good transfer of heat of the device 1 from the upper surface 11 to the separation member 6. The side plate 73 is made to be easily bendable to a degree facilitating the insertion of the foot plate 74 into the lock plate 75.

The above-described separation member 6 and the mounting structural section 7 thereof are used in the following manner to demonstrate the operation effect thereof.

If four devices 1 are mounted on the burn-in board 51 when a burn-in test is conducted, the mounting structural section 7 onto which the separation member 6 is mounted so as to protrude downward is placed so that the separation member 6 comes into contact with the four devices 1, the distal end sides of the side plates 73 are moved closer to each other, while compressing the bellows 71 from above, the original state is then restored and the foot plate 74 is inserted into the lock plate 75.

As a result of this operation, the separation member 6 is pressed against the upper surface 11 of the device by the elastic force of the bellows 71, and the mounting structural section 7 is also attached to the burn-in board 51. Those operations are easy to conduct. Furthermore, as shown in FIG. 6(c), if an inclined portion 74a is provided at the foot plate 74, the operation of the side plate 73 and foot plate 74 is further facilitated, because when the two plates are pushed down from above, the inclined portion 74a moves as shown by the figure's two-dot-dash line and the foot plate 74 can be inserted below the lock plate 75. The inclined portion may be also provided on the lock plate 75.

Subsequent operations are identical to those explained with reference to the apparatus shown in FIG. 1. With the apparatus of the present example, the air and mist sprayed from the sprayer 4 do not fall directly on the upper surface 11 of the device. Instead a structure is provided in which heat of the upper surface 11 easily passes to the upper surface of the separation member 6. Therefore, the temperature of this upper surface rises to a temperature close to the temperature of the upper surface 11 of the device and when the air and mist fall on the surface 6a on the opposite side serving as the upper surface of the separation member in the same manner as shown in FIG. 1, the air and mist are heated, the mist is evaporated, and the necessary amount of heat generated by the device can be removed from the upper surface 11 of the device via the surface 6a on the opposite side and the separation member 6.

On the other hand, because the air and mist do not fall directly on the upper surface 11 of the device, the upper surface 11 is not affected by the collisions with the air or mist and the possibility of contamination or discoloration of the upper surface 11 can be reliably prevented. Furthermore, the effect of mist on the electric structural sections such as the device 1, socket 55, and burn-in board 51 is eliminated.

Thus, it is possible to prevent completely the process in which the mist is evaporated, the air contained therein is humidified to a high degree, this highly humid air is partially cooled to a temperature below the dew point and moisture in the air forms condensate on the upper partition plate 56a serving as a ceiling among the partition plates 56 that have a low temperature inside the closed space 58, and the condensate flows down onto the electrical structural sections located below, or in which sometimes the humid air forms condensate directly on the electrical structural sections, or in which water pools are formed therebelow due to insufficient evaporation of mist, this process causing the electric sections to malfunction due to short circuiting or inducing rust and damage thereof.

Other appropriate structures, such as those shown in FIGS. 7(c) to (f) and FIG. 8, can be used for pressing the separation member 6 against the surface 11 of the device. In the structure shown in FIG. 7(c), a compression spring 79a is added to augment the elastic force of the bellows 71 that serves to press the separation member 6 to the upper surface 11 of the device 1 when this elastic force is insufficient. In the structure shown in FIG. 7(d), a plate material 78 is used in place of the bellows as a member surrounding the separation member 6, and the separation member 6 is pressed against the upper surface 11 by applying a tensile force with a tension spring 79b. Employing such contact pressure structures makes it possible to press the separation member against the upper surface 11 with a sufficient and necessary force, further improving the heat transfer therebetween.

In the structure shown in FIG. 7(e), a rod-like heat-dissipating fin 6a is fixedly attached to the separation member 6. As a result, cooling performance of the device 1 can be further improved. Furthermore, in the structure shown in FIG. 7(f), the mist can be also sprayed on the bellows 71 by slightly raising the sprayer 4 and widening the spraying angle. As a result, the bellows 71 acts as a heat transfer body of enlarged surface area of heat exchange and the cooling effect of the device 1 can be improved.

Figure 8:
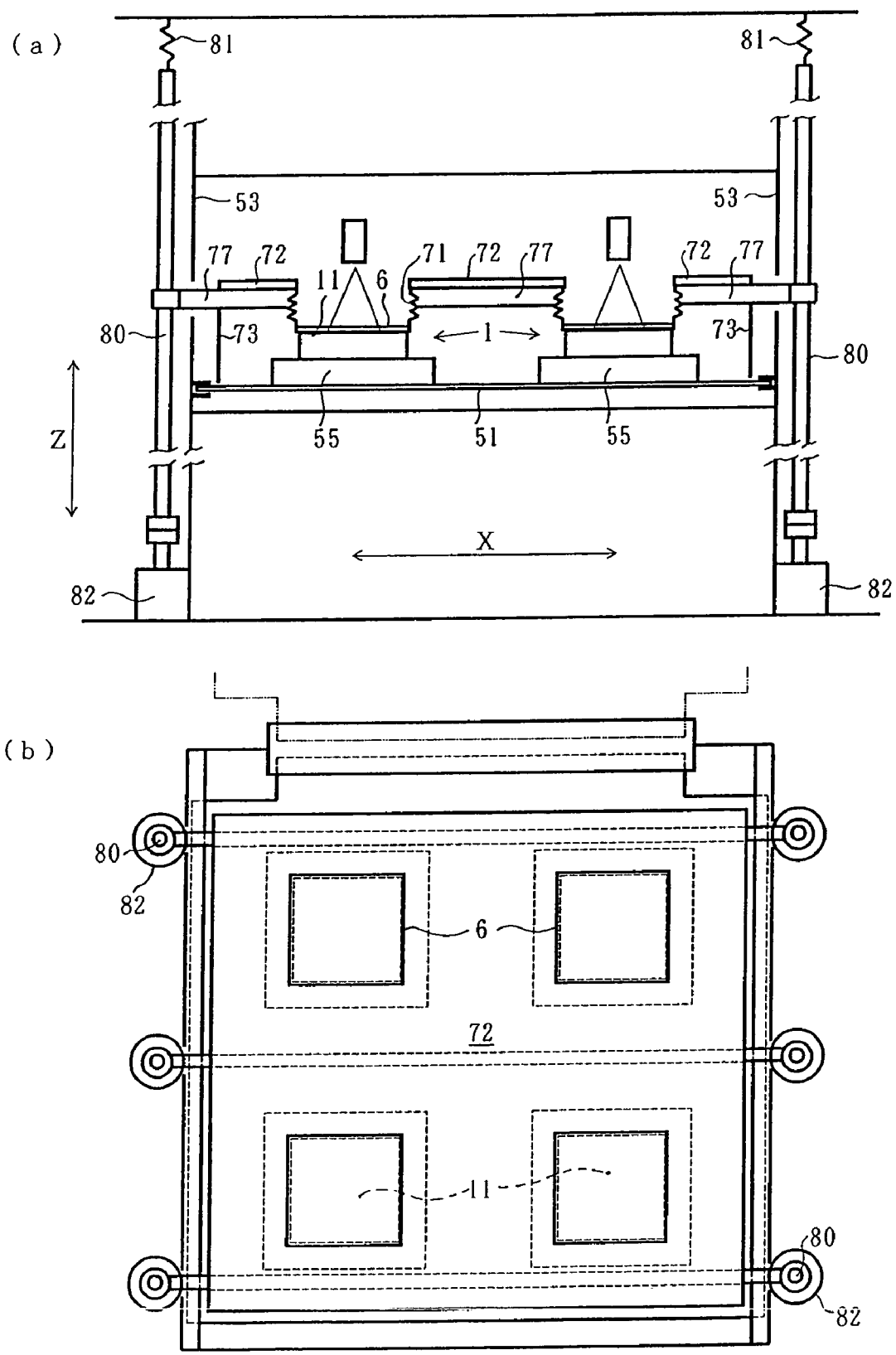
FIG. 8 is an explanatory drawing illustrating an example of a mechanized pressure contact structure; (a) and (b) are the front and plan views of the inner side thereof.

FIG. 8 shows an example of the structure for pressing the separation member 6 against the upper surface 11 of the device with a mechanical force.

In the structure of this example, the lateral bar 77 attached to the support plate 72 extends in the X direction to the outside of the case 53, both end portions thereof are joined to shafts 80 extending in the vertical Z direction, the shafts 80 are suspended by the upper ends thereof with the springs 81, while being appropriately guided in the vertical direction, and the lower end positions thereof can be moved in the Z direction by vertical movement apparatuses 82 such as cylinder mechanisms. A plane frame joined to the shafts on one side or to all the shafts and moved and guided in the Z direction may be provided and this frame may be moved in the vertical direction with vertical movement apparatuses 82 (one apparatus at each side or one apparatus for all the shafts), rather than moving each shaft 80 in the vertical direction with separate vertical movement apparatuses 82.

If the mounting structural section 7 is used in such an apparatus, when a burn-in test is conducted, the separation member 6 can be pressed against the upper surface 11 by simple operations comprising the steps of detachably mounting the device 1 on the board 51 in the same manner as in the usual apparatus, mounting the board 51 on the test area such as a burn-in apparatus or burn-in rack, and then actuating the vertical movement apparatus 82. Thus, the operations of applying pressure to the separation member or releasing the pressure applied thereto can be further facilitated.

Figure 9:
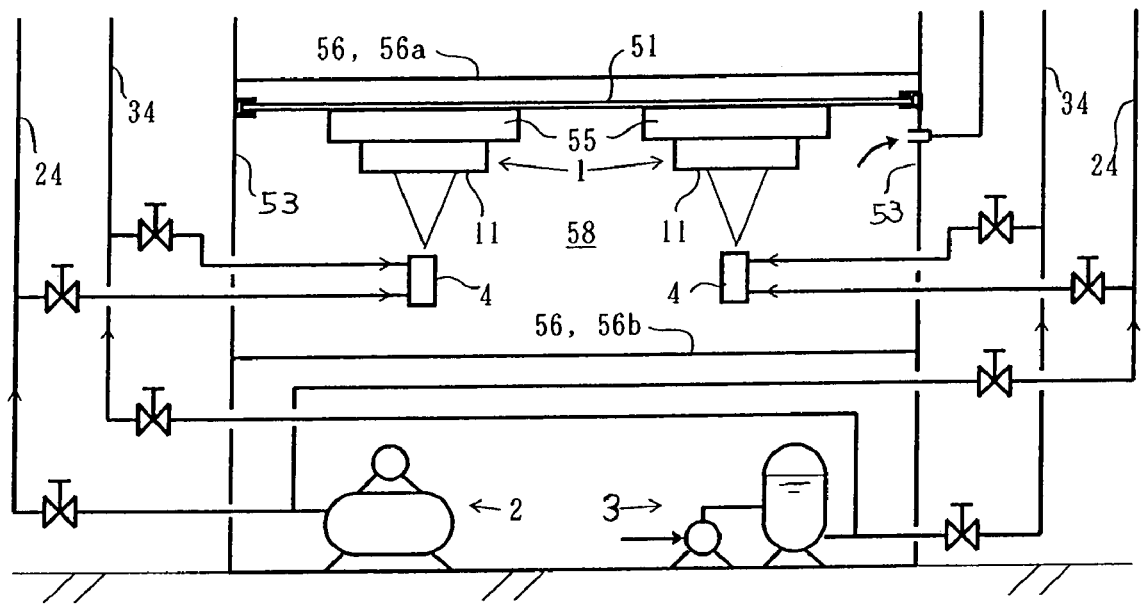
FIGS. 9(a) and (b) are explanatory drawings illustrating the entire configuration of another example of the cooling apparatus employing the present invention and also showing the front view state of the inner side thereof.
Figure 9:
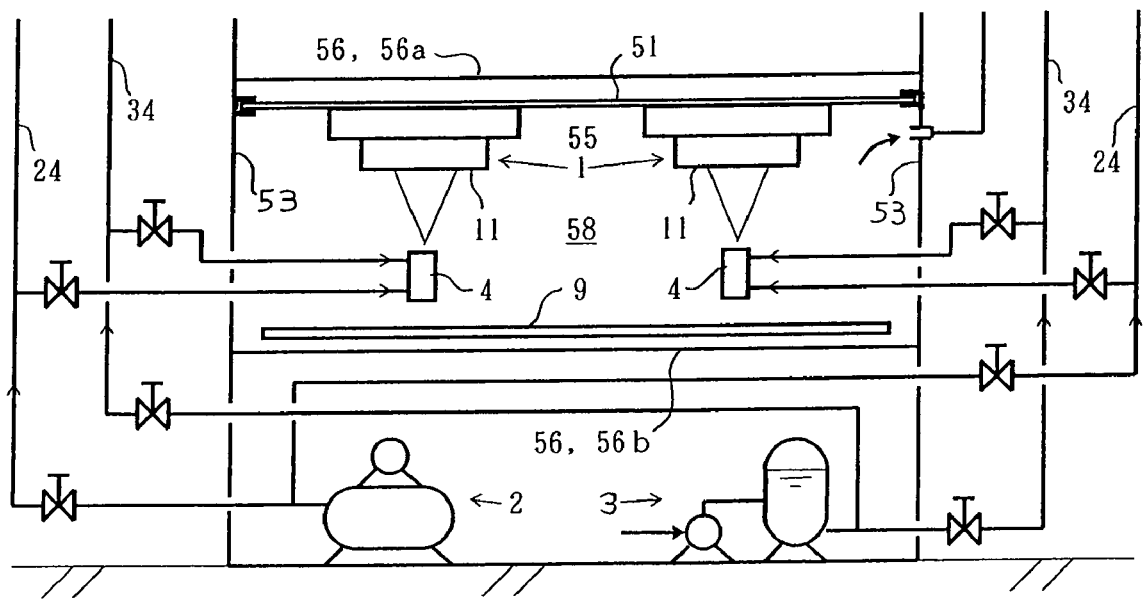

FIG. 9 shows yet another example of the cooling apparatus employing the present invention. In this figure, some of the reference symbols denoting the structural components identical to those shown in FIG. 1 are omitted.

In the apparatus of the present example, as shown in FIG. 9(a), the sprayer 4 is disposed in a closed space 58, which is the space surrounded by the partition plate 56 and case 53 as a structural body, and the upper surface 11 of the device 1 faces downward.

In order to obtain an apparatus in which the upper surface 11 of the device 1 faces downward, a structure is employed in which the inside of the closed space 58 shown in FIG. 1(a) and the components located therein are turned over in the vertical direction. Thus, the front and rear surfaces of the burn-in board 51 are inverted in the position below the upper partition plate 56a of the partition plates 56, a socket 55 is mounted downwardly on the front surface side of the burn-in board, the device 1 is attached thereto, the upper surface 11 of the device is oriented downward, the sprayer 4 is located below the upper surface, and the sprayer 4 is also turned over in the vertical direction so as to spray the air and mist upward on the upper surface 11, which faces downward.

The apparatus of the present example operates in exactly the same manner and demonstrates the same operation effect as the apparatus of FIG. 1. Thus, in the apparatus of the present example, the air and mist are sprayed upward and fall on the upper surface 11 facing downward, and though the air has a sufficiently small specific gravity and the mist is water with a large specific gravity, a small particle diameter is obtained, the particles have a sufficiently small weight, and they are present in a high-speed air flow. Therefore, gravity produces practically no effect on the movement thereof. As a result, when the mist falls on the upper surface 11, even the part thereof that was not instantaneously evaporated does not move in the direction of falling down under gravity, the trajectory thereof is deflected from the propagation direction at the time of ejection, moves in the direction along the upper surface 11, without moving in the direction of falling under gravity, and is reliably evaporated in the course of this movement.

Furthermore, the upper surface 11, which is to be cooled, faces down, but heat at the time of heat generation by the device 1 is transferred by thermal conduction, and the convection produces practically no effect. As a result, the effects in the vertical direction are not correlated with heat transfer. Therefore, the cooling effect is absolutely identical to that produced when the upper surface 11 was cooled from above, as shown in FIG. 1.

Furthermore, with the apparatus of the present example, even when the separation member 6 and the mounting structural section 7 therefor, which are shown in FIG. 6, are not provided, an operation effect close to that of the apparatus shown in FIG. 6 can be obtained. Thus, the upper partition plate 56a assumes a position above the burn-in board 51 that is not affected by the air with high humidity and no water from condensation adheres to the surface of the plate. Therefore, the problem of the water from condensation falling down on the electric structural components is resolved. Furthermore, even in those cases where the water ejected from the sprayer 4 when the operation is started falls down in the form of droplets, without forming a mist, or the mist is not entirely evaporated and is collected below, the water or mist will be collected on the lower partition plate 56b serving as a floor of the partition plates 56. Therefore, the problems of the electric components malfunctioning due to short circuiting, or being damaged or rusted are almost fully resolved. Furthermore, if the compressed air is heated, water remaining in the sprayer 4 after the mist has been sprayed can be evaporated and water drops can be prevented from falling when the operation of the apparatus is stopped or immediately after it was started.

FIG. 9(b) shows an example, in which a cooling plate 9 is provided as a cooling structure that is cooled to a temperature lower than the temperature of the case 53 and partition plate 56 when the device 1 is cooled to the target temperature. This cooling plate 9 is cooled with a cooling water pipe or a coolant pipe of a simple refrigerator (not shown in the figures) so that the cooling plate assumes a temperature lower than the temperature of case 53 and partition plate 56 that are heated to a temperature higher than the normal temperature by a high-temperature environment inside the closed space 58.

If such a cooling plate is provided, water vapor forms condensate from the high-humidity air located inside the closed space 58, the humidity inside this space is removed, and the formation of condensate on electric components is prevented, thereby maintaining them in even better state.

Figure 10:
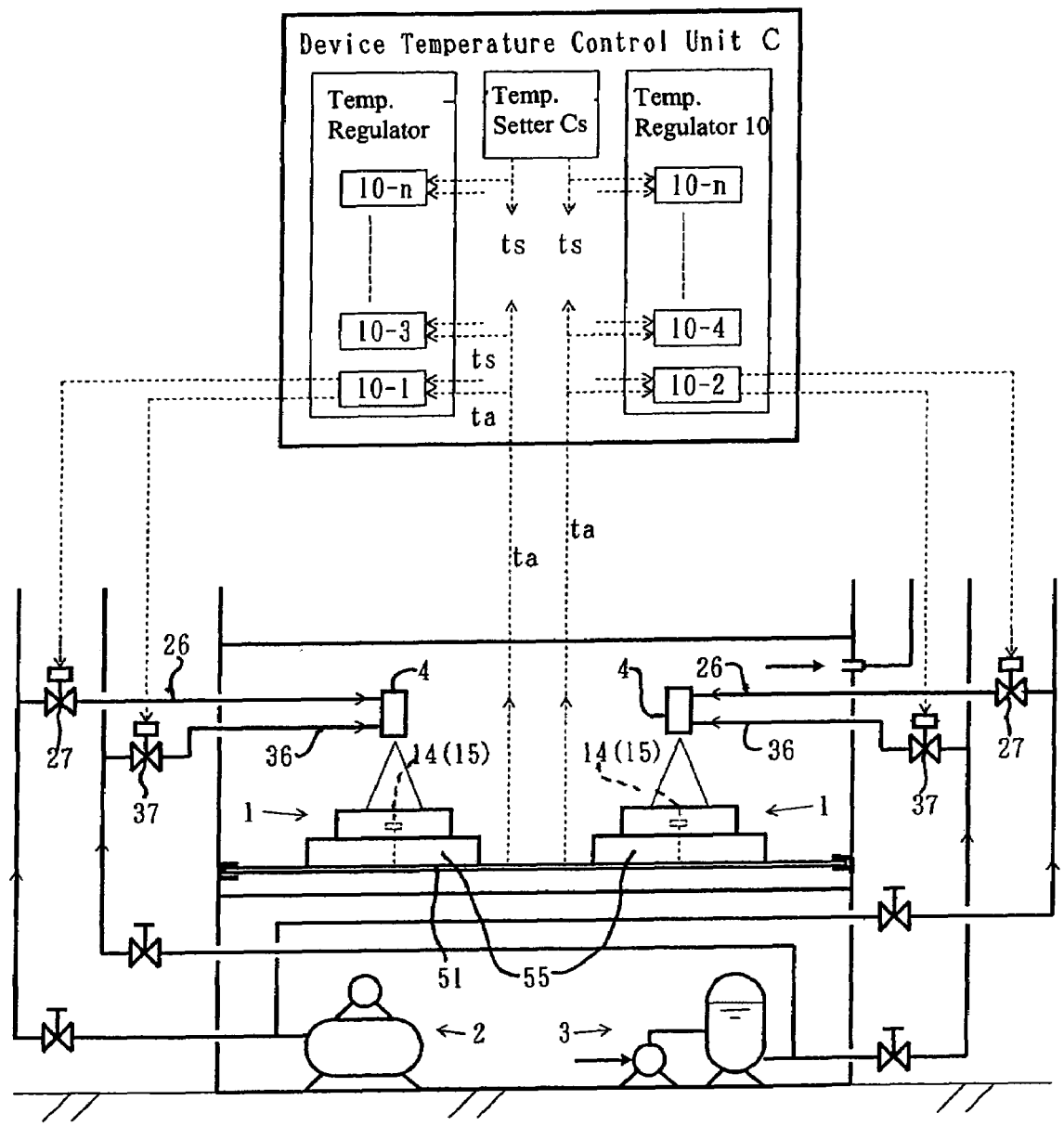
FIG. 10 is an explanatory drawing illustrating the control system of the cooling apparatus employing the present invention.

FIG. 10 shows a configuration example relating to automation of the cooling apparatus.

The apparatus of the present example comprises a temperature sensor 14, which is also shown in FIG. 3, as temperature detection means for detecting the temperature of the device 1, electric individual water valves 37 (referred to hereinbelow as "valves 37") as flow rate adjustment means for adjusting the flow rate of liquids, and a temperature regulator 10 as control means for controlling the valves 37 so that the temperature ta detected by the temperature sensor 14 becomes a set temperature ts of the device 1 when it is burnt in, this temperature serving as a target temperature. The temperature regulator 10 is incorporated in a device temperature control unit C.

As described hereinabove, the signals of the temperature sensor 14 are fetched from a control board (not shown in the figure) after passing from the device 1 to the socket 55 and from the burn-in board 51 via a relay board, but in the figure they are shown to be fetched from the burn-in board 51. The valves 37 are operated by motors (not shown in the figure) rotating in response to pulse signals supplied thereto.

The set temperature ts can be set to any temperature by a temperature setter Cs provided in the device temperature control unit C, for example to 150° C. This ts is transmitted to the temperature regulator 10. In the case where the device 1 does not contain the temperature sensor 14, a provisional temperature sensor 15 shown in FIG. 3 is mounted as temperature detection means, and control is so conducted that the detected temperature $ta_1$ thereof becomes a set temperature ts1. In this case, the correspondence of ts1 and ts is clarified in advance with a separate test or the like. The temperature regulator 10 is provided, for example, for every 20 devices with numbers 10-*l* to 10-*n* in correspondence with the temperature sensors 14 provided for each device.

With such a control unit, in a burn-in test conducted continuously within a long interval, manual operations, including preliminary adjustment of opening degree of individual water valves in the case of the apparatus shown in FIG. 1, are rendered unnecessary, thereby saving labor. Moreover, the automatic operation can increase reliability during operation. Furthermore, because the opening degree of each electric individual water valves 37 is controlled independently, all the 20 devices 1 are not controlled in the same manner. Thus, even when the devices generating different amounts of heat are present among the 20 devices 1, the amount of water necessary for cooling the corresponding device can be supplied by automatically adjusting the degree of opening of each valve 37. Therefore, devices generating different amounts of heat can be tested with one burn-in apparatus and the utility of the apparatus is improved. In this case when the temperature at which the burn-in test has to be conducted differs between the devices, the set temperatures tsi that differ accordingly between the devices, rather than the same set temperature ts, are provided by the temperature setter Cs to the corresponding temperature regulators 10-*i*.

In this control, the amount of water is changed, but because with the present invention, fine particles are obtained by mixing water with air, even if the flow rate of water is changed, the size of fine particles is not changed significantly. As a result, water is evaporated reliably. Therefore, water flow rate control conditions are good, thereby making it possible to conduct the burn-in test with good accuracy in which the temperature ta during burn-in is brought sufficiently close to the set temperature ts.

As described hereinabove, the burn-in temperature can be controlled with a sufficiently-high accuracy even when the air flow rate is fixed and only the amount of water is adjusted, but in the cooling apparatus of the present example, the valves of the individual air system 26 are also the electric individual air valves 27 (referred to hereinbelow as "valves 27"), control signals of the temperature regulator 10 are also sent to the valves 27 and combined control of the valves 37 and valves 27 is conducted not only during normal operation, but also when the apparatus is started and stopped.

Thus, the temperature regulator 10 carries out control so that if the difference between ta and ts set to 150° C. is, for example, 3° C. or more, a signal corresponding to this difference is sent to valves 37 providing for a large cooling effect, the degree of opening of the valves 37 is adjusted, ta is rapidly brought close to ts, and if the difference becomes 3° C. or less, a signal corresponding to this difference is sent to valves 27 providing for a small cooling effect, the degree of opening of the valves 27 is adjusted, ta is finely adjusted, the difference between ta and ts is made sufficiently small, and the accuracy of burn-in temperature is improved.

In combined control of the valves 37 and the valves 27, the operation effect differs depending on the structure of the sprayer 4. Thus, with the sprayer 4 shown in FIG. 2(*a*), when the degree of opening of the valves 27 is controlled, the air flow rate is thereby caused to fluctuate, but those fluctuations cause practically no changes in the amount of water passing through the sprayer 4. Therefore, the cooling effect is changed by changes in the air flow rate.

On the other hand, with the sprayer 4 shown in FIG. 2(*b*), when the degree of opening of valves 27 is controlled, the air flow rate is thereby caused to fluctuate, but even if the degree of opening of valves 37 is not changed, the amount of water passed through the sprayer 4, that is, the amount of water converted into a mist changes, as described hereinabove, and the relationship between the changes is such that if the amount of air is increased, the amount of water drops, and if the amount of air decreases, the amount of water increases. However, because it is the changes in the amount of water that control the changes in the amount of heat removed by cooling, eventually, if the amount of air increases, the amount of heat removed by cooling decreases, and if the amount of air decreases, the amount of heat removed by cooling increases.

Therefore, in the case of the sprayer shown in FIG. 2(*a*), the switching direction of the valves 37 is inverted when the amount of heat removed by cooling is increased and decreased. As shown hereinabove, the sprayer 4 shown in FIG. 2(*b*), which changes the amount of heat removed by cooling by changing the air flow rate, is capable of adjusting the amount of heat removed by cooling with better accuracy and speed. Therefore, the electric individual air valves 27, which also change the amount of water, are equivalent to a flow rate adjustment means that is capable of adjusting the flow rate of liquid together with the valves 37 and the sprayer 4 shown in FIG. 2(*b*).

The control is so conducted that when an electric current is passed through the device 1 and the burn-in test is started, the valves 27 are opened for a constant time at a constant degree of opening, regardless of the difference between ta and ts, the temperature of the device 1 through which the current was passed rises at an appropriate rate and a smooth transition is made to a stationary state in which the valves 37 are controlled. When the current is cut off from the device 1 and the burn-in test is completed, the valves 37 are closed, the air supply is maintained by opening the valves 27 for a constant time at a constant degree of opening, and the closed space that assumed a state of a high humidity is dried by using excess heat of the device 1 that generated heat. With such a control, the entire burn-in test can be conducted under good conditions.

When the valves 27 are provided in addition to the valves 37 as flow rate adjustment means, as in the present example, a configuration is also possible in which they are used as liquid flow rate adjustment valves and compressed air flow rate adjustment valves, and the temperature regulator 10 serving as control means adjusts the opening degree of the valves 37 and valves 27 so as to change the ratio of liquid flow rate and air flow rate, thereby controlling ta so that it becomes ts. In this case, too, ta can be adjusted to ts with good accuracy by using the compressed air, which is suitable for finely adjusting the amount of heat.

The explanation was provided hereinabove with reference to the case, where the cooling apparatus was employed in a burn-in apparatus, but the cooling apparatus in accordance with the present invention can be also employed in various other apparatuses for cooling devices that generate a large amount of heat. Furthermore, examples were explained where water was used as a heat transfer medium, but appropriate coolants with a low saturation temperature such as perfluorocarbons can be also used as a heat transfer medium when the cooling apparatus is employed in other apparatuses, including the burn-in apparatuses.

The present invention can be advantageously used in burn-in apparatuses, in particular, for those semiconductor devices that generate a large amount of heat. The present invention may be embodied in other specific forms without departing from its spirit or essential characteristics. The described embodiments are to be considered in all respects only as illustrative and not as restrictive. The scope of the invention is, therefore, indicated by the appended claims and their combination in whole or in part rather than by the foregoing description. All changes that come within the meaning and range of equivalency of the claims are to be embraced within their scope.

We claim:

1. A cooling apparatus for cooling a semiconductor device to a target temperature at which said semiconductor is burnt in at atmospheric pressure;
said semiconductor device including a first surface, said first surface being planar, said semiconductor device passing electric current therethrough and generating heat so that a temperature thereof rises above said target temperature and a temperature of said first surface rises;
said apparatus comprising:
compressed air supply means configured to supply compressed air at an initial stage when the electric current starts passing through the semiconductor device and thereafter;
liquid supply means for supplying liquid, said liquid being water, that cools said semiconductor device, said liquid having a saturation temperature at said atmospheric pressure that is lower than said temperature of said first surface when said temperature of said first surface rises, said liquid supply means being configured to be started after said temperature of said first surface exceeds said saturation temperature; and
a sprayer configured to receive said compressed air and said liquid and to mix said compressed air and said liquid so that said liquid atomizes and expands radially and reaches said first surface.

2. A cooling apparatus according to claim 1, wherein said first surface faces downward.

3. The cooling apparatus of claim 1, wherein
said liquid supply means stops supplying liquid after said electric current to said semiconductor device is cut off and said temperature falls below the target temperature, and
said compressed air supply means continues supplying air for a period of time after the electric current to the semiconductor device is cut off and then stops supplying air.

4. The cooling apparatus of claim 1, wherein in a final stage when said electric current stops passing through said semiconductor device, said liquid supply means is configured to terminate the liquid supply, and the compressed air supply means is configured to maintain the compressed air supply until an original dry state of an ambient atmosphere of said semiconductor device is restored.

5. The cooling apparatus of claim 1, wherein said liquid supply means is for sensing the temperature of said first surface and for controlling supply of the liquid as a function of the temperature of said first surface and is configured to supply said liquid only after said liquid supply means determines that said temperature of said first surface exceeds said saturation temperature.

6. The cooling apparatus of claim 1, further comprising
a temperature sensor provided so as to sense the temperature of said first surface; and
a water valve provided so as to be capable of regulating a liquid supply from said liquid supply means, wherein said water valve is configured to permit the liquid supply means to supply said liquid only after said temperature sensor senses that said temperature of said first surface exceeds said saturation temperature.

7. A cooling apparatus for cooling a semiconductor device to a target temperature at which said semiconductor is burnt in at atmospheric pressure;
said semiconductor device including a first surface, said first surface being planar, said semiconductor device passing electric current therethrough and generating heat so that a temperature thereof rises above said target temperature and a temperature of said first surface rises;
said apparatus comprising:
compressed air supply means configured to supply compressed air at an initial stage when the electric current starts passing through the semiconductor device and thereafter;
liquid supply means for supplying liquid, said liquid being water, that cools said semiconductor device, said liquid having a saturation temperature at said atmospheric pressure that is lower than said temperature of said first surface when said temperature of said first surface rises, said liquid supply means being configured to be started after said temperature of said first surface exceeds said saturation temperature;
a separation member that is pressable against said first surface so that said separation member covers said first surface and transfers heat from said first surface, said separation member being separable from said first surface; and
a sprayer configured to receive said compressed air and said liquid and to mix said compressed air and said liquid so that said liquid atomizes and expands radially and reaches a surface of said separation member on a side opposite from said first surface.

8. The cooling apparatus of claim 7, wherein
said liquid supply means stops supplying liquid after said electric current to said semiconductor device is cut off and said temperature falls below the target temperature, and
said compressed air supply means continues supplying air for a period of time after the electric current to the semiconductor device is cut off and then stops supplying air.

9. The cooling apparatus of claim 7, wherein in a final stage when said electric current stops passing through said semiconductor device, said liquid supply means is configured to terminate the liquid supply, and the compressed air supply means is configured to maintain the compressed air supply until an original dry state of an ambient atmosphere of said semiconductor device is restored.

10. The cooling apparatus of claim 7, wherein
said separation member is in a form of a curved thin sheet that is convex on a side proximal to said first surface and pressable against said first surface so that said separation member lays flat against and covers said first surface.

11. The cooling apparatus of claim 1 or 7, further comprising:
a temperature detection means for detecting a temperature of said semiconductor device;
flow rate adjustment means for adjusting a flow rate of said liquid; and
control means for controlling said flow rate adjustment means so that said semiconductor device is cooled whereby said temperature detected by said temperature detection means becomes said target temperature.

12. The cooling apparatus of claim 11, wherein:
said flow rate adjustment means comprises:

a liquid flow rate adjustment valve for adjusting a flow rate of said liquid supplied from said liquid supply means; and a compressed air flow rate adjustment valve for adjusting a flow rate of said compressed air supplied from said compressed air supply means; and said control means controls said liquid flow rate adjustment valve and said compressed air flow rate adjustment valve for changing a ratio of said flow rate of said liquid to said flow rate of said compressed air.

* * * * *